United States Patent [19]
Tujide et al.

[11] Patent Number: 5,548,211
[45] Date of Patent: Aug. 20, 1996

[54] DYNAMIC FAULT IMAGING SYSTEM USING ELECTRON BEAM AND METHOD OF ANALYZING FAULT

[75] Inventors: Tohru Tujide; Toyokazu Nakamura; Kiyoshi Nikawa, all of Tokyo, Japan

[73] Assignee: NEC Corporation, Tokyo, Japan

[21] Appl. No.: 400,199

[22] Filed: Mar. 3, 1995

Related U.S. Application Data

[63] Continuation of Ser. No. 854,570, Mar. 20, 1992, abandoned.

[30] Foreign Application Priority Data

| Mar. 22, 1991 | [JP] | Japan | 3-081182 |
| Mar. 22, 1991 | [JP] | Japan | 3-081183 |
| Mar. 22, 1991 | [JP] | Japan | 3-081184 |
| Mar. 22, 1991 | [JP] | Japan | 3-081185 |

[51] Int. Cl.$^6$ .................................. G01R 31/28
[52] U.S. Cl. ..................... 324/158.1; 324/750; 324/751
[58] Field of Search .................. 324/73.1, 158.1, 324/751, 765, 750; 250/310, 311; 356/384, 400, 401, 396; 382/8; 348/125, 126, 129, 130, 189

[56] References Cited

U.S. PATENT DOCUMENTS

| 4,358,732 | 11/1982 | Johnston et al. | 250/311 |
| 4,644,584 | 2/1987 | Nagashima et al. | 382/48 |
| 4,692,690 | 9/1987 | Hara et al. | 324/158 R |
| 4,706,019 | 11/1987 | Richardson | 324/158 D |
| 4,721,909 | 1/1988 | Richardson | 324/158 R |
| 4,745,362 | 5/1988 | Brust | 324/158 R |
| 4,803,357 | 2/1989 | Brust | 250/310 |
| 4,805,123 | 2/1989 | Specht et al. | 382/48 |
| 4,820,977 | 4/1989 | Brust | 324/751 |
| 4,853,622 | 8/1989 | Brust | 324/158 R |
| 4,870,344 | 9/1989 | Stille | 324/158 R |
| 4,870,357 | 9/1989 | Young et al. | 324/158 R |
| 4,965,515 | 10/1990 | Karasawa | 324/73.1 |
| 4,978,908 | 12/1990 | Mahart-Shetti et al. | 324/158 R |
| 5,054,097 | 10/1991 | Flinois et al. | 382/44 |

FOREIGN PATENT DOCUMENTS 0226494  6/1987  European Pat. Off.

OTHER PUBLICATIONS

Journal of Vacuum Science and Technology: Part B, vol. 8, No. 6, Nov. 1990, New York US, pp. 2037–2040, Radzimsky et al, "Electron beam testing of integrated circuits with multilevel metal".

*Primary Examiner*—Vinh P. Nguyen
*Attorney, Agent, or Firm*—Sughrue, Mion, Zinn, Macpeak & Seas

[57] ABSTRACT

A dynamic fault analyzing system discontinuously radiates an electron beam onto a semiconductor integrated circuit device applied with a test pattern for monitoring a secondary electron beam produced in the semiconductor integrated circuit device, and the intensity of the secondary electron beam is varied depending upon combination of voltage level and topography of a wiring pattern incorporated in the semiconductor integrated circuit device, wherein a fault is detectable from discrepancy between variation of the secondary electron beam produced in a defective product and variation of the secondary electron beam produced in an excellent product; however, the variation of the secondary electron beam contains topographic information, and the failure origin is easily specified on an image produced on the basis of the topographic information.

12 Claims, 25 Drawing Sheets

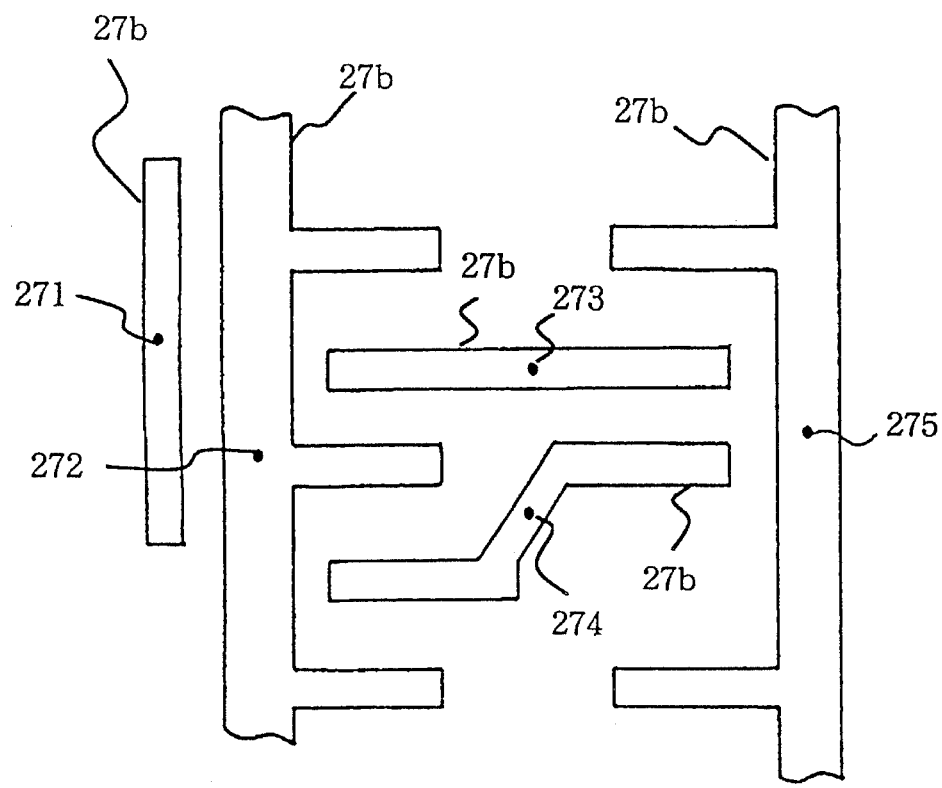
FIG.15A
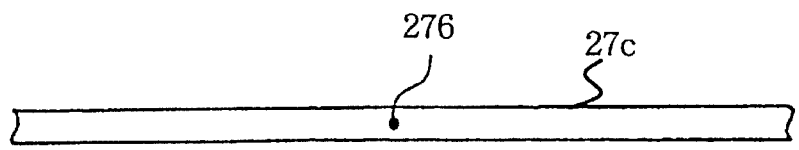
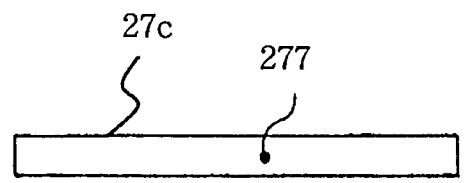
FIG.15B

DYNAMIC FAULT IMAGING SYSTEM USING ELECTRON BEAM AND METHOD OF ANALYZING FAULT

This is a continuation of application Ser. No. 07/854,570, filed Mar. 20, 1992, now abandoned

FIELD OF THE INVENTION

This invention relates to a fault analysis for a semiconductor integrated circuit device and, more particularly, to a fault analysis through radiation of electron beam onto the semiconductor integrated circuit device.

DESCRIPTION OF THE RELATED ART

The integration density of a semiconductor integrated circuit has been continuously increased, and the circuit pattern thereof is now extremely complex. In fact, hundreds of thousands logic gates are incorporated in a semicustom-made integrated circuit, and component transistors come up to millions. In this situation, if a fault takes place in such a large scale semiconductor integrated circuit, a large amount of time and labor is consumed to analyze and specify the fault. Even if the circuit designer is involved in the analysis, more than one month would pass away. It seems to be impossible for any person except for the circuit designer to specify the failure origin, and users also encounter difficulty in the analysis. The fault analysis is indispensable for improving production yield, and process engineers are expected to analyze and specify the failure origin in a manufacturing facility of, for example, an ASIC or a single-chip microcomputer.

In order to support the fault analysis, circuit designers tend to integrate various built-in diagnostic circuits. However, this approach enlarges the semiconductor chip, and a built-in diagnostic circuit designed for an integrated circuit is hardly generalized and, accordingly, less applicable to another integrated circuit.

T. C. May proposed an analyzing technology in "Dynamic Fault Imaging of VLSI Random Logic Device", 1984 IEEE/IRPS pages 95 to 108, and the dynamic fault imaging is an attractive analyzing technology in view of wide applications. In the dynamic fault imaging, when electron beam is radiated onto an large scale integrated circuit driven by an LSI tester, secondary electrons are produced in the large scale integrated circuit, and the intensity of the secondary electron beam is variable dependent on the potential levels of wirings incorporated in the large scale integration. If a wiring is in relatively high potential level, a significant amount of secondary electrons are attracted to the wiring, and, accordingly, the secondary electron beam is relatively low in the intensity. However, if another wiring is in relatively low potential level, most of the secondary electrons is detectable, and the secondary electron beam is relatively high in the intensity. Therefore, if the large scale integrated circuit is swept with the electron beam, the potential of the wiring pattern is represented by the variation of the secondary electron beam in the intensity, and a voltage contrast image is produced from the variation of the secondary electron beam. The discrepancy between the fault LSI voltage contrast and the fault-free one shows the failure image.

FIG. 1 shows the sequence of the dynamic fault imaging. The ordinate is indicative of coordinate for a large scale integrated circuit, and the abscissa stands for time. While going down along the ordinate, we can move from the peripheral to the center of the large scale integrated circuit is increased. The LSI tester sequentially supplies test patterns with time from the left side to the right side. Simultaneously, the voltage contrast is monitored for both fault and fault-free LSIs with every test pattern, and the subtracted image data indicative of the failure are memorized. In FIG. 1, electrical failure occurs inside of the large scale integrated circuit at time t0, and reaches a pad at the peripheral of the large scale integrated circuit device at time t1. The test patterns are backwardly traced, and analysis proceeds along the abscissa from the right side toward the left side. Namely, if the digital output signal produced in the presence of the pattern at time t0 is inconsistent with an expected value, a fault takes place, and the image data at time t0 are compared with image data for the potential contrast produced from a fault-free large scale integrated circuit. Discrepancy therebetween is indicative of the electrical failure origin indicated by an encircled dot. By tracing back the discrepancy or failure image from the pad area to the inside area, the analyst specifies the failure origin at time t0.

The dynamic fault imaging is desirable for not only the circuit designer but also any person, because any person can analyze and find a failure origin without the layout data of the large scale integrated circuit.

However, a problem inherent in the prior art dynamic fault imaging is encountered in that the sweep with the electron beam consumes an extremely large amount of time. For example, if a large scale integrated circuit fabricated on a semiconductor chip of 10 millimeters by 10 millimeters is swept with an electron beam covering area of 400 microns by 400 microns, the electron beam needs to sweep the semiconductor chip 625 times. If the large scale integration was judged faulty at 3000th test pattern, the sweep to be repeated from the first to 3000th test patterns for one area needs several minutes to tens minutes. Therefore, the analysis consumes several days until the failure origin is specified by using both fault and fault-free images for all the area of a chip of 10 millimeters by 10 millimeters.

SUMMARY OF THE INVENTION

It is therefore an important object of the present invention to provide a dynamic fault analyzing system which supports an operator to easily specify a failure origin.

It is another important object of the present invention to provide a method of analyzing a fault which allows an analyst to easily specify a failure origin.

To accomplish the object, the present invention proposes to display an image indicative of voltage contrast and topography of a wiring pattern.

In accordance with one aspect of the present invention, there is provided a dynamic fault imaging system for a semiconductor integrated circuit device having a plurality of wiring strips different in depth from a surface of the semiconductor integrated circuit device: comprising; a) a test pattern generating unit operative to supply a test pattern to the semiconductor integrated circuit device, and allowing a high voltage level and a low voltage level to be selectively applied to the plurality of wiring strips; b) a radiating unit operative to radiate an electron beam onto the semiconductor integrated circuit device, a secondary electron beam being produced in the semiconductor integrated circuit device, the intensity of the secondary electron beam being varied depending upon the combination of voltage level on the wiring strips and the depth of the wiring strips; c) a control unit operative to control relative relation between the semiconductor integrated circuit device and the electron beam for allowing the electron beam to fall onto a surface of the semiconductor integrated circuit device; d) a detecting unit operative to monitor the secondary electron beam radiated from the surface of the semiconductor integrated circuit device, and forming a detected signal indicative of variation of the intensity of the secondary electron beam; and e) a data processing unit responsive to the detected signal for forming an image indicative of topography of the plurality of wiring strips, and displaying the image on a screen of a display unit.

In accordance with another aspect of the present invention, there is provided a method of imaging a fault, comprising the steps of: a) preparing a semiconductor integrated circuit device having a wiring pattern implemented by a plurality of wiring strips different in depth from a surface of the semiconductor integrated circuit device; b) changing relative relation between an electron beam and a surface of the semiconductor integrated circuit device under application of a test pattern thereto for allowing the semiconductor integrated circuit device to produce a secondary electron beam therefrom, the intensity of the secondary electron beam being varied depending upon combination of voltage level on the plurality of wiring strips and the depth of each of the plurality of wiring strips; c) monitoring the secondary electron beam for producing a detected signal indicative of voltage contrast of the plurality of wiring strips and topography of the wiring pattern; d) producing topography data indicative of the topography of the wiring pattern from the detected signal; and e) displaying an image indicative of the topography of the wiring pattern.

In accordance with yet another aspect of the present invention, there is provided a method of analyzing a fault, comprising the steps of: a) preparing an excellent semiconductor integrated circuit device, a defective semiconductor integrated circuit device and a layout pattern of multi-level wiring strips common to the excellent and defective semiconductor integrated circuit devices; b) determining radiation spots for layout pattern of the multi-level wiring strips; c) sequentially radiating electron beam onto the radiation spots of the excellent semiconductor integrated circuit device under application of a test pattern for allowing first secondary electron beam to be produced therein, the intensity of the first secondary electron beam being variable with voltage level of the multi-level wiring strips; d) forming an image of voltage contrast of the multi-level wiring strips of the excellent semiconductor integrated circuit device from the secondary electron beam; e) sequentially radiating electron beams onto the radiation spots of the defective semiconductor integrated circuit device under application of the test pattern for allowing second secondary electron beam to be produced-therein, the intensity of the second secondary electron beam being variable with voltage level of the multi-level wiring strips; f) forming an image of voltage contrast of the multi-level wring strips of the defective semiconductor integrated circuit device; and g) comparing the image of voltage contrast produced for the defective semiconductor integrated circuit device with the image of voltage contrast produced for the defective semiconductor integrated circuit device so as to search for a discrepancy indicative of a failure origin of the defective semiconductor integrated circuit device.

In accordance with yet another aspect of the present invention, there is provided a method of analyzing a fault, comprising the steps of: a) preparing an excellent semiconductor integrated circuit device free from any fault and a defective semiconductor integrated circuit device with a fault, each of the excellent and defective semiconductor integrated circuit devices having a plurality of wiring strips different in depth from a source of the each of the excellent and defective semiconductor integrated circuit devices; b) changing relative relation between an electron beam and a surface of the excellent semiconductor integrated circuit device under application of a test pattern thereto for allowing the excellent semiconductor integrated circuit device to produce a first secondary electron beam therefrom, the intensity of the first secondary electron beam being varied depending upon combination of voltage level on the plurality of wiring strips and the depth of the plurality of wiring strips; c) monitoring the first secondary electron beam for producing a first detected signal indicative of voltage contrast of the plurality of wiring strips and topography of the plurality of wiring strips; d) producing topography data indicative of the topography of the plurality of wiring strips of the excellent semiconductor integrated circuit device and first voltage contrast data indicative of voltage contrast of the plurality of wiring strips on the basis of the first detected signal; e) sequentially supplying a set of test patterns to the excellent semiconductor integrated circuit device under radiation of an electron beam onto predetermined spots on a surface of the defective semiconductor integrated circuit device for allowing the predetermined spots to produce a second secondary electron beam from the electron beam, the intensity of the second secondary electron beam being varied depending upon combination of voltage level on the plurality of wiring strips and the depth of the plurality of wiring strips; f) monitoring the second secondary electron beam for producing a second detected signal indicative of voltage contrast of the plurality of wiring strips of the defective semiconductor integrated circuit device and topography of the plurality of wiring strips; and g) specifying a fault origin in the defective semiconductor integrated circuit device on the basis of discrepancy between the first voltage contrast data and second voltage contrast data indicative of voltage contrast of the plurality of wiring strips of the detective semiconductor integrated circuit device and produced from the first detected signal.

BRIEF DESCRIPTION OF THE DRAWINGS

The features and advantages of the dynamic fault imaging system and the method according to the present invention will be more clearly understood from the following description taken in conjunction with the accompanying drawings in which:

FIG. 15A is a plan view showing appropriate radiation spots of first-level aluminum wirings selected in the analysis implementing the second embodiment;

FIG. 15B is a plan view showing radiation spots selected from second-level wring strips;

DESCRIPTION OF THE PREFERRED EMBODIMENTS

First Embodiment

Figure 1:
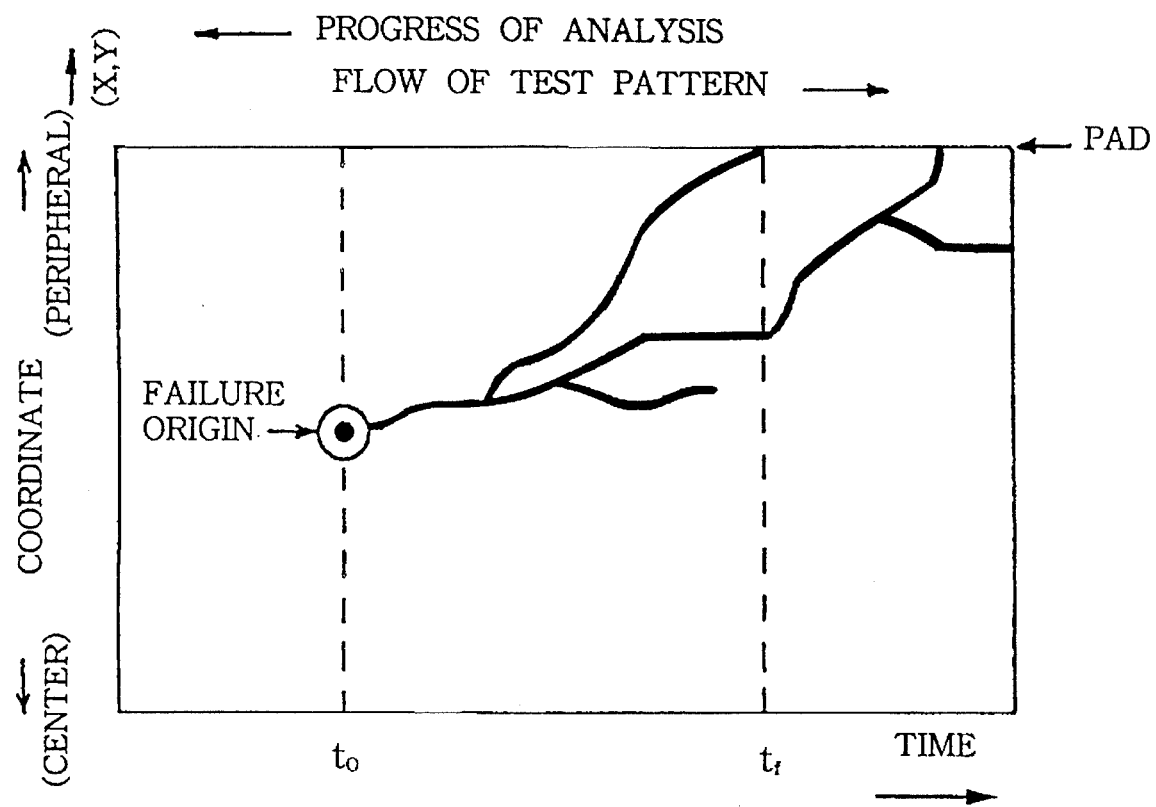
FIG. 1 is a diagram showing the sequence of the prior art dynamic fault imaging.
Figure 2:
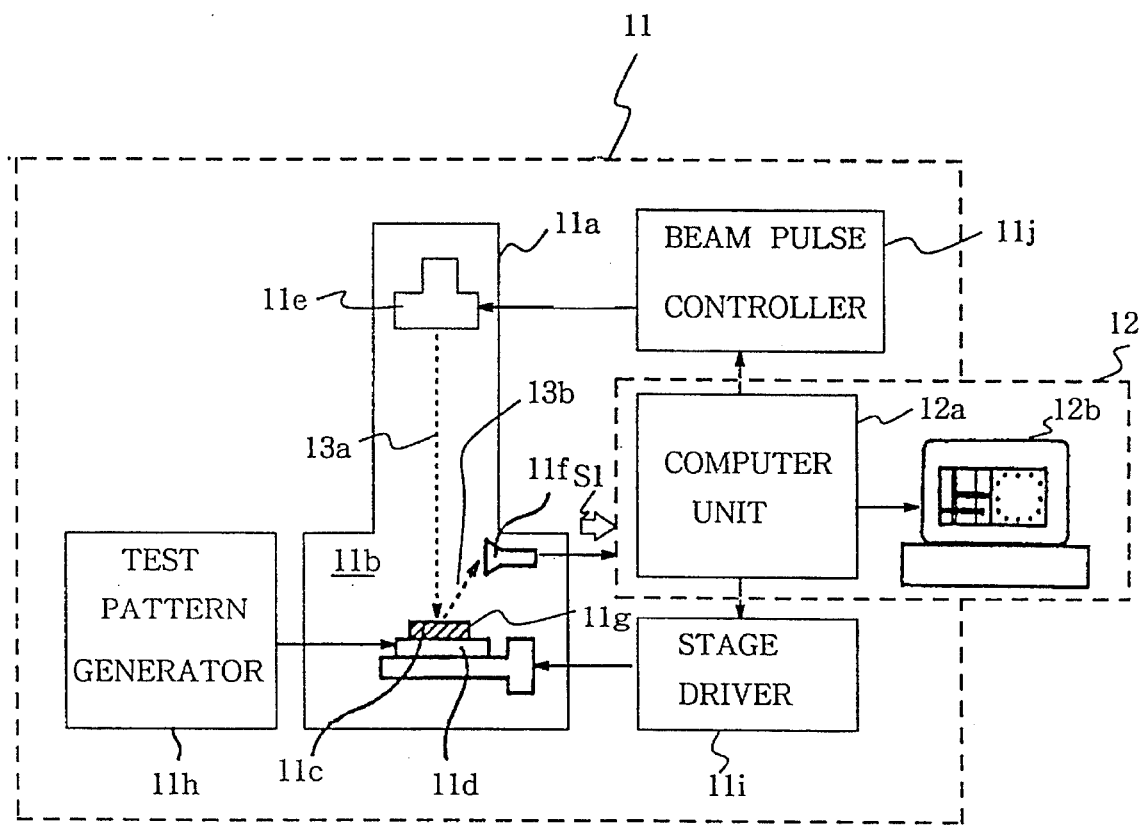
FIG. 2 is a view showing the arrangement of a dynamic fault imaging system according to the present invention.

Referring to FIG. 2 of the drawings, a dynamic fault imaging system embodying the present invention largely comprises an electron beam tester 11 and a data processor 12 associated therewith. The electron beam tester 11 has a lens-barrel defining a chamber 11b, and a test board 11c mounted on an x-y stage 11d, an electron beam projector 11e and a secondary electron detector 11f are installed in the chamber 11b. A semiconductor integrated circuit device 11g is placed on the test board 11c, and a test pattern generator 11h supplies a string of test patterns through the test board 11c to the semiconductor integrated circuit device 11g. As will be described hereinlater, the semiconductor integrated circuit device 11g has a wiring pattern implemented by a plurality of multi-level wiring strips. The x-y stage 11d is associated with a stage driver 11i, and is two-dimensionally movable with respect to the electron beam projector 11e. The electron beam projector 11e is associated with a beam pulse controller 11j, and intermittently radiates a string of electron beam pulses 13a onto the semiconductor integrated circuit device 11g. When the electron beam pulse 13a is incident into the large scale integrated circuit device 11g, secondary electrons are produced in the large scale integrated circuit device 11g, and a secondary electron beam 13b is radiated from the large scale integrated circuit 11g to the secondary electron detector 11f. Since the x-y stage 11d associated with the stage driver 11i changes the relative locational relation between the string of electron beam pulse 13a and the large scale integrated circuit device 11g, the secondary electron beam 13b is varied in the intensity depending upon potential level of the wiring pattern incorporated in the large scale integrated circuit 11g and depth of the wiring pattern. The x-y stage 11d and the stage driver 11i as a whole constitute a control unit.

The potential level of the wiring pattern is variable with a test pattern supplied from the test pattern generator 11h, and the depth is measured from the top surface of the large scale integrated circuit and the wiring pattern.

The intensity of the secondary electron beam 13b is varied depending upon the potential level and the topography of the wiring pattern as described hereinbefore, and the secondary electron detector 11f produces a detected signal S1 indicative of the intensity of the secondary electron beam 13b. The detected signal S1 is supplied to a computer unit 12a incorporated in the data processor 12, and sequentially stored in a memory unit of the computer unit 12a. If the x-y stage sequentially changes the relative locational relation between the string of the electron beam 13a and the large scale integrated circuit device 11g, a series of the detected signals S1 form intensity data in the memory unit of the computer unit 12a, and the intensity data is representative of voltage contrast of the wiring pattern and of topography of the wiring pattern. The computer unit 12a executes a predetermined program sequence for data processing on the intensity data, and allows a display unit 12b to display an image for the wiring pattern on the screen thereof. The image provides information of the voltage contrast as well as of the topography of the wiring pattern to an analyst.

If a fault takes place in the large scale integrated circuit device 11g, a wiring strip associated with the failure origin is different in potential level from the corresponding wiring strip incorporated in a fault-free product. Therefore, discrepancy takes place between the image for the fault product and the image for the fault-free product, and the analyst can easily specify the failure origin on the screen of the display unit 12b.

Figure 3:
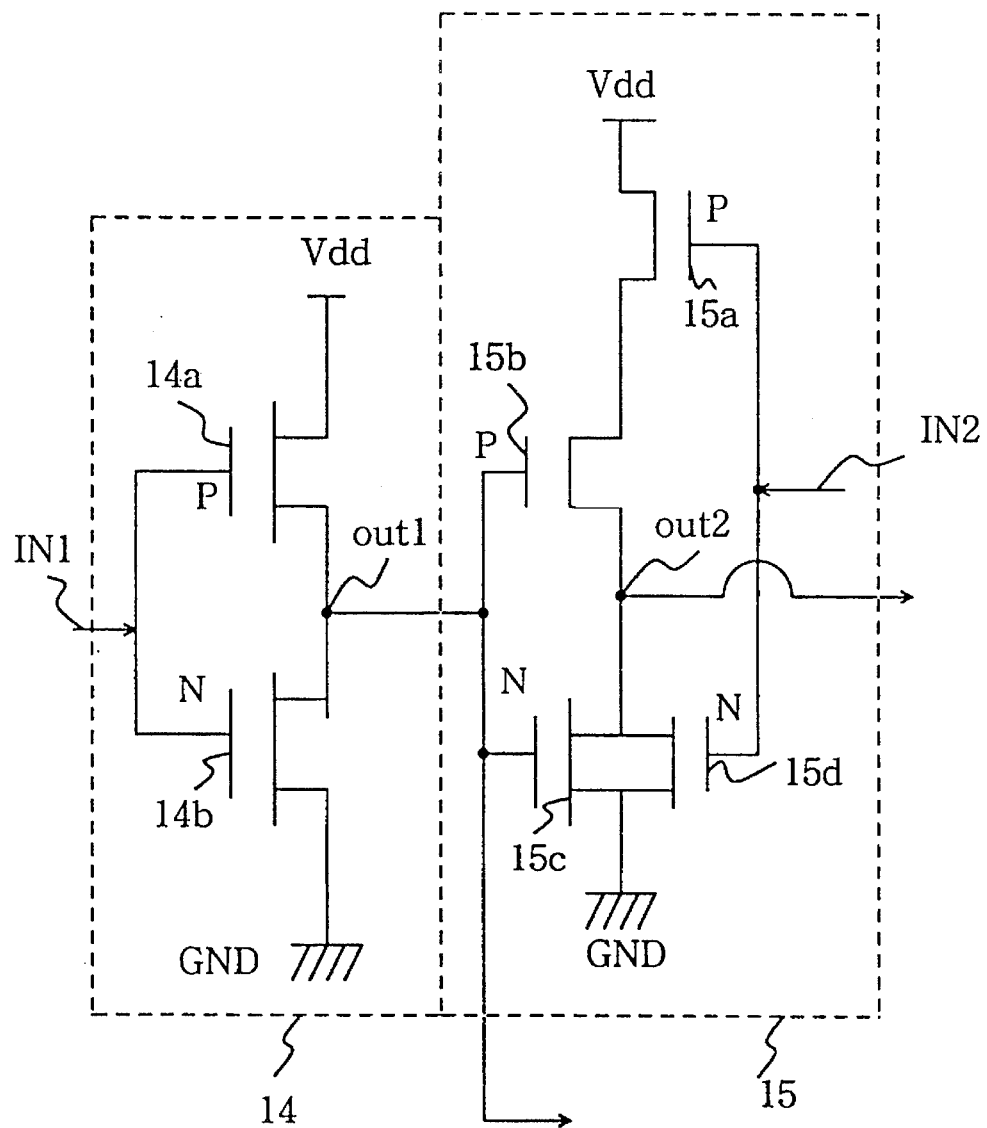
FIG. 3 is a circuit diagram showing the circuit arrangement of an electronic circuit subjected to an analysis according to the present invention.

A method of imaging a fault embodying the present invention is described in detail with reference to FIGS. 3 to 10. First, description is made on a principle of imaging a wiring pattern employed in the method. Assuming now that an electric circuit shown in FIG. 3 is incorporated in the large scale integrated circuit fabricated on the semiconductor large scale integrated circuit device 11g, the electric circuit shown in FIG. 3 is implemented by an inverter 14 and a two-input NOR gate 15. The inverter 14 is a series combination of a p-channel enhancement type field effect transistor 14a and an n-channel enhancement type field effect transistor 14b coupled between a power voltage line Vdd and a ground voltage line GND, and a first input signal IN1 is supplied to the gate electrodes of the field effect transistors 14a and 14b. The complementary signal of the input signal IN1 is directly taken out from the output node OUT1 of the inverter circuit 14, and is further supplied to one of the two input nodes of the NOR gate 15. The NOR gate 15 is implemented by a series combination of p-channel enhancement type field effect transistors 15a and 15b coupled between the power voltage line Vdd and an output node OUT2 and a parallel combination of n-channel enhancement type field effect transistors 15c and 15d coupled between the output node OUT2 and the ground voltage line GND. The complementary signal of the input signal IN1 is supplied to the gate electrodes of the field effect transistors 15b and 15c, and another input signal IN2 is supplied to the gate electrodes of the field effect transistors 15a and 15d. The output signal of the NOR gate 15 takes place at the output node OUT2.

Figure 4:
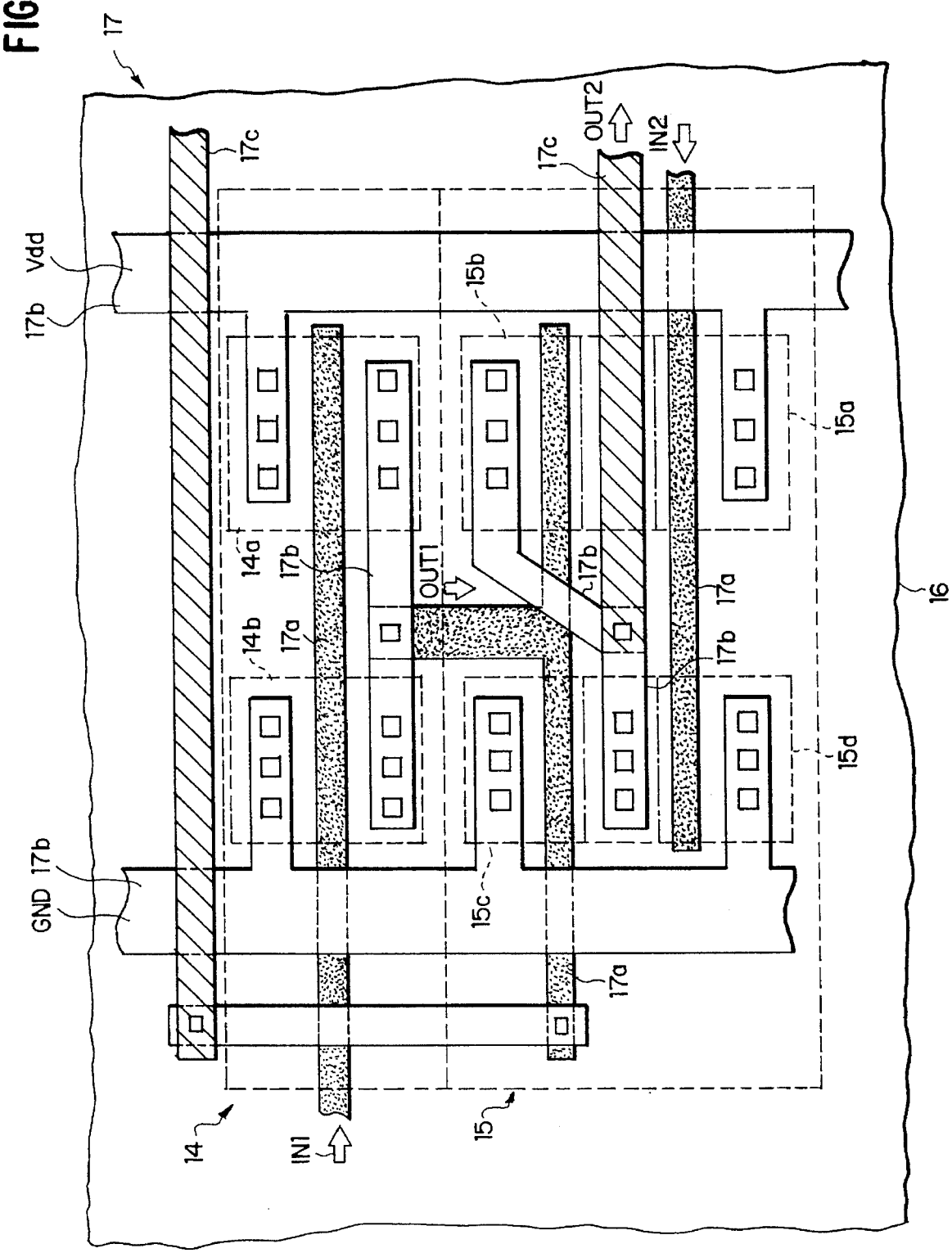
FIG. 4 is a plan view showing the layout of the electronic circuit shown in FIG. 3 and incorporated in a semiconductor integrated circuit device.
Figure 5:
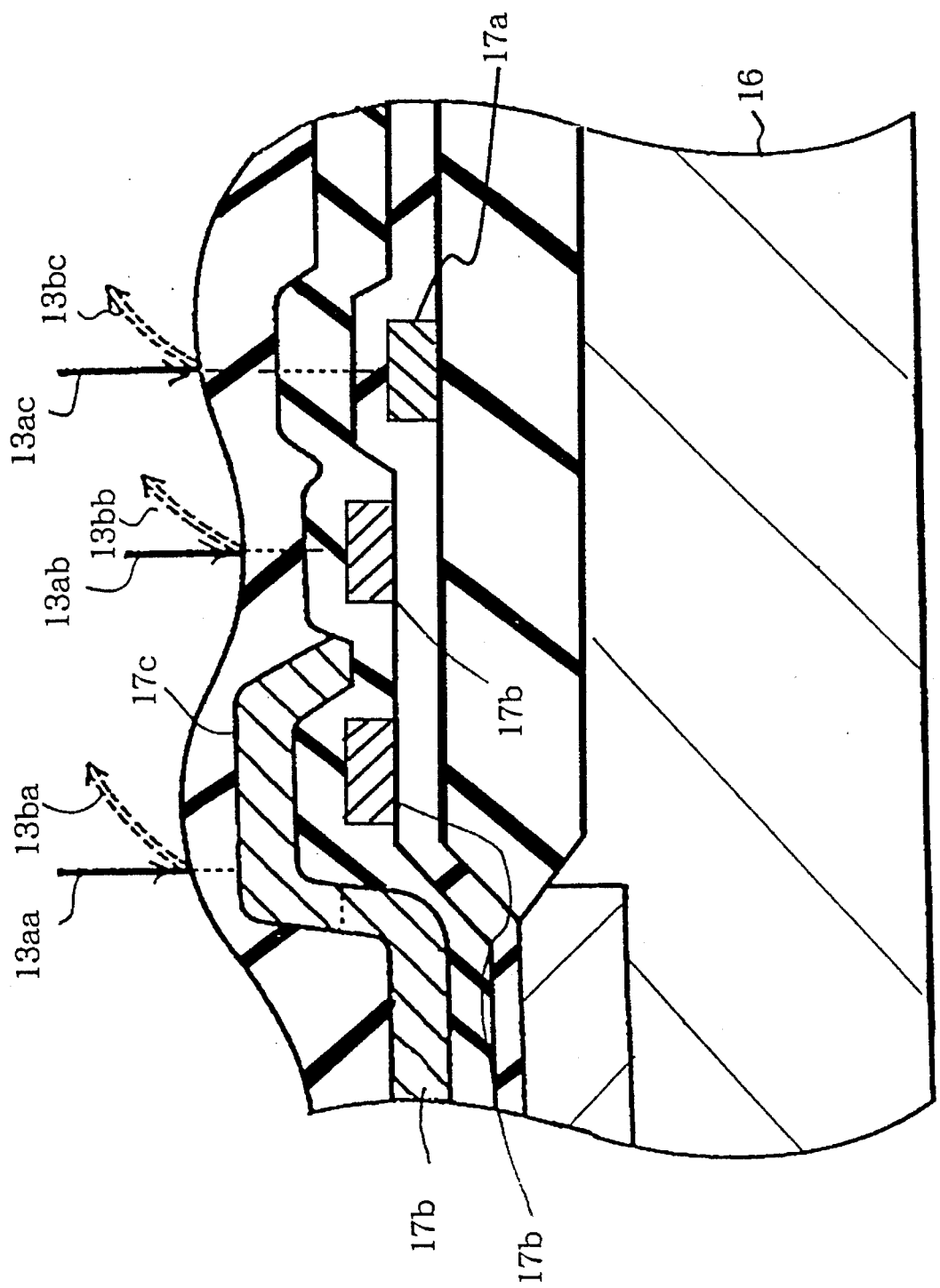
FIG. 5 is a cross sectional view showing the structure of the semiconductor integrated shown in FIG. 4.

The electric circuit shown in FIG. 3 is fabricated on a semiconductor chip 16, and has a multi-level wiring pattern 17 as shown in FIG. 4. Although inter-level insulating films are deleted FIG. 4 for better understanding, the multi-level wiring pattern 17 has the lowest polysilicon strips 17a, first-level aluminum strips 17b and second-level aluminum strips 17c electrically isolated by means of the inter-level insulating films as shown in FIG. 5. In FIG. 4, small dots are applied to the lowest level polysilicon strips 17a, and the second-level aluminum strips 17c are hatched for the sake of better discrimination. Small boxes are indicative of locations of contact holes for interconnecting conductive strips on different levels.

If the electron beam pulses 13a are radiated onto the semiconductor large scale integrated circuit device as indicated by arrows 13aa, 13ab and 13ac, the electron beam pulses 13aa, 13ab and 13ac are fallen onto respective areas over the second-level aluminum strip 17c, the first-level aluminum strip 17b and the lowest polysilicon strip 17a, and secondary electrons 13ba, 13bb and 13bc are radiated therefrom. The intensity of each secondary electron beam 13ba, 13bb or 13bc is indicative of the potential level of the strip 17c, 17b or 17a and the depth from the top surface.

Figure 6:
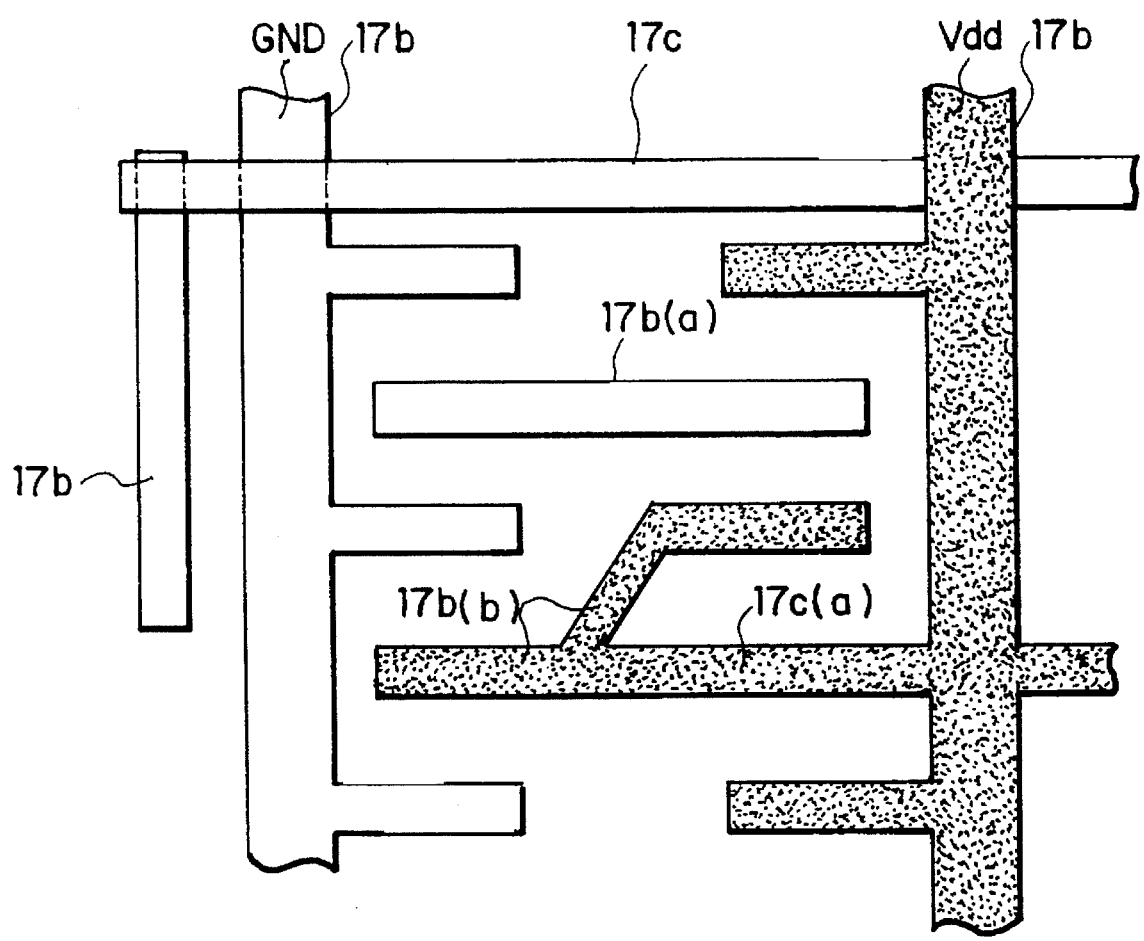
FIG. 6 is a view showing an image of voltage contrast produced from the layout of the electronic circuit shown in FIG. 4.

If a test pattern supplied from the test pattern generator 11h has the input signal IN1 of the high voltage level and the input signal IN2 of the low voltage level, the inverter circuit 14 produces the complementary signal of the low voltage level, and the complementary signal of the low voltage level is NORed with the input signal IN2 of the low voltage level for producing the output signal OUT2 of the high voltage level. When the NOR operation is completed, the potential levels of all the strip 17a, 17b and 17c are determined, and the input signal IN1 of the high voltage level and the input signal IN2 of the low voltage level cause the strips 17b and 17c to have the respective potential levels as shown in FIG. 6. The low or the ground voltage level GND is indicated in white, and the high or the power voltage level Vdd are indicated in black. However, the polysilicon strips 17a are deleted from FIG. 6 for the sake of simplicity. Since the first-level aluminum strip 17b(a) propagates the complementary signal of the ground voltage level, the first-level aluminum strip 17b(a) is indicated in white. However, the first-level aluminum strip 17b(b) supplies the power voltage level from the p-channel enhancement type field effect transistor 15b to the n-channel enhancement type field effect transistors 15c and 15d as well as to the second-level aluminum strip 17c(a), the first-level aluminum strip 17b(b) and the second-level aluminum strip 17c(a) are indicated in black. Thus, the first-level aluminum strips 17b(a) and 17b(b) are equal in depth and different in potential level, and the secondary electron beams for the first-level aluminum strips 17b(a) and 17b(b) are different in intensity because of the attractive force exerted on the secondary electrons. Moreover, since the first-level aluminum strip 17b(b) and the second-level aluminum strip 17c(a) are equal in potential level and different in depth, the secondary electron beams for the first-level aluminum strip 17b(b) and the second-level aluminum strip 17c(a) are also different in the intensity.

Figure 7:
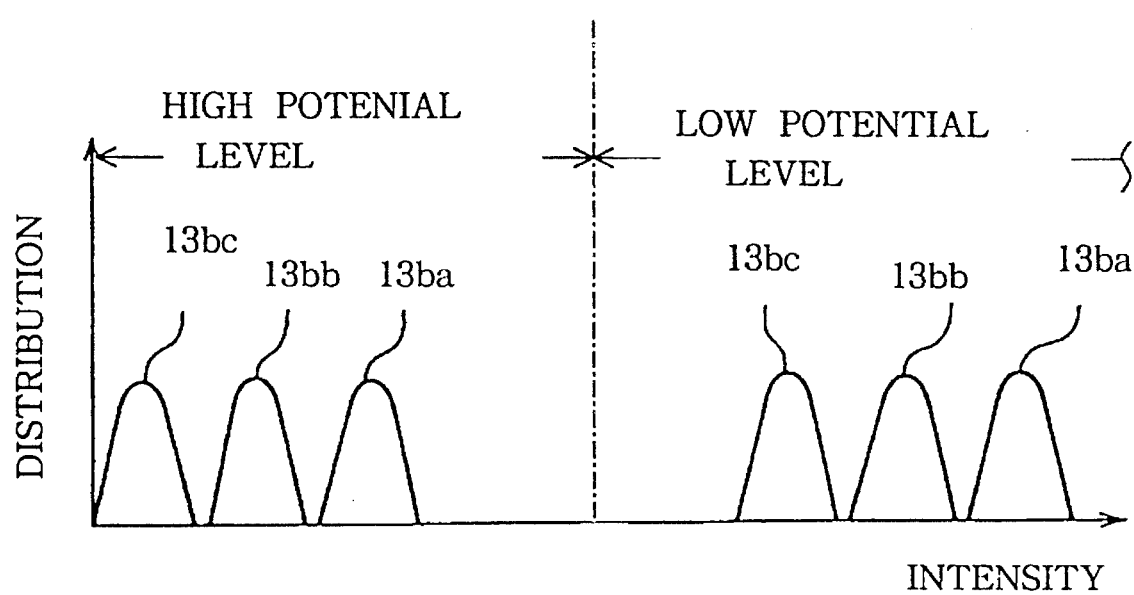
FIG. 7 is a graph showing the distribution of intensity of second electrons produced in the structure shown in FIG. 5.

Therefore, while the strips 17a, 17b and 17c shown in FIG. 5 are in the high potential level, the secondary electron beams 13bc, 13bb and 13ba are in relatively low intensity range as shown in FIG. 7. However, if the strips 17a, 17b and 17c are decreased in the potential level, the secondary electron beams 13bc, 13bb and 13ba are shifted to relatively high intensity range. This means that the secondary electron beam 13b contains not only potential information but also topographic information.

Figure 8:
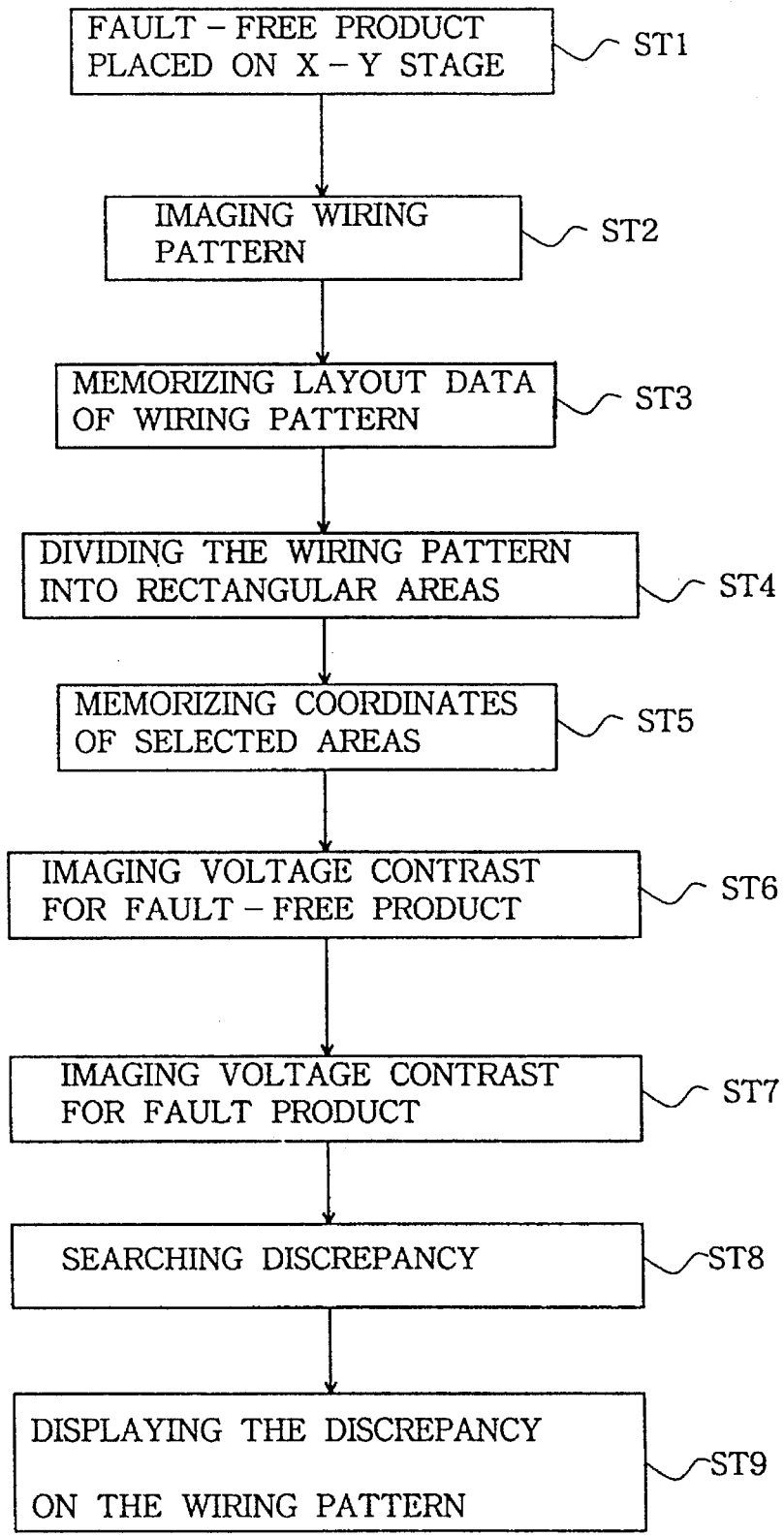
FIG. 8 is a flow chart showing the sequence of the analysis according to the present invention.

Turning to FIG. 8 of the drawings, the sequence of the method for imaging a fault starts with preparation of an excellent or fault-free product. The fault-free product is placed on the test board 11c of the electron beam tester 11 as by step ST1, and the test pattern generator 11h supplies a test pattern through the test board 11c to the fault-free product. The stage driver 11i sequentially drives the x-y stage 11d, and the beam pulse controller 11j controls the electron beam generator 11e to radiate the electron beam pulses 13a onto the fault-free product. The electron beam pulses 13a sweeps throughout the fault-free product, and, accordingly, the secondary electron detector 11f produces the detected signal S1 the intensity of which is varied depending upon the voltage contrast as well as the topography of the wiring pattern 17. Since the sweep with the electron beam pulses 13a aims at imaging the layout of the wiring pattern 17, the computer unit 12a ignores the voltage contrast of the wiring pattern 17, and produces layout data indicative of a three-dimensional wiring pattern 17 from the topographic information contained in the detected signals S1 as by step ST2. The strips 17a to 17c may be differently colored on the screen of the display unit 12b. The layout data are stored in the memory unit as by step ST3.

Figure 9A:
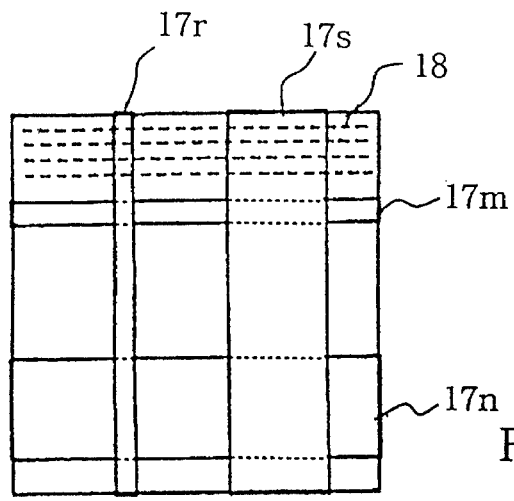
FIGS. 9A to 9E are views describing how to determine spots where electron beam pulses are projected.
Figure 9B:
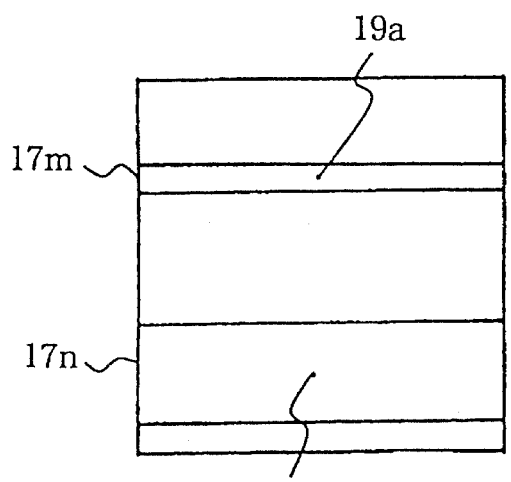
Figure 9D:
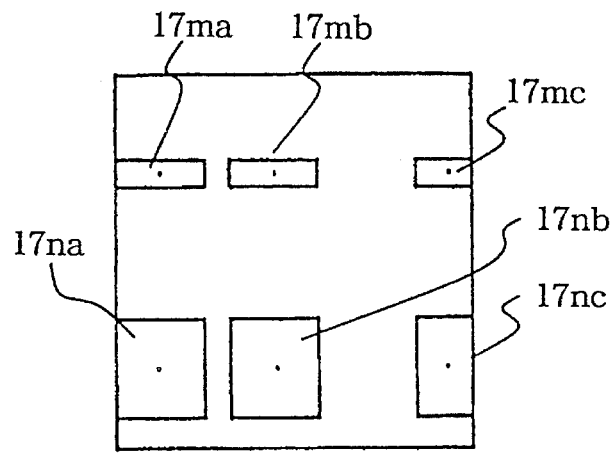
Figure 9C:
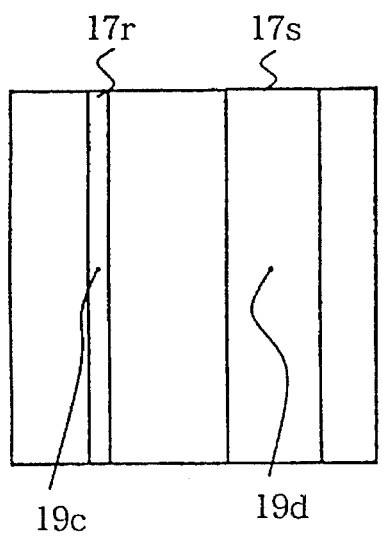
Figure 9E:
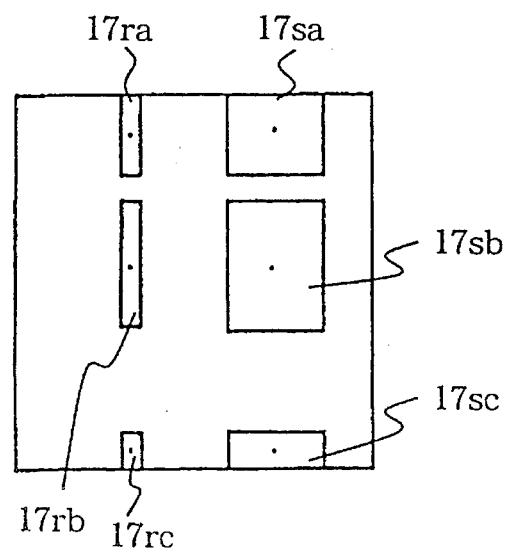
Figure 10:
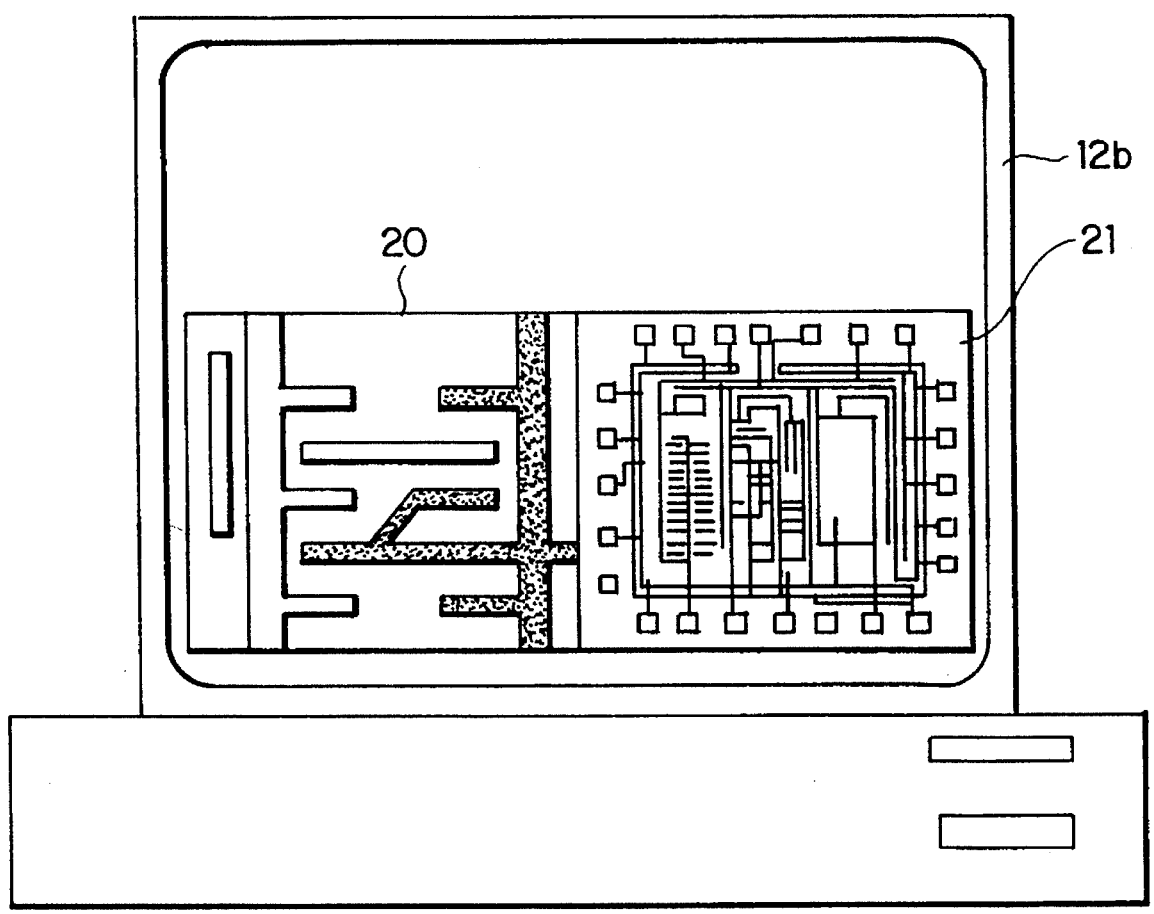
FIG. 10 is a front view showing the screen of a display unit incorporated in the dynamic fault imaging system shown in FIG. 2.

Subsequently, the computer unit 12a accesses the layout data, and virtually divides the wiring pattern 17 into a plurality of rectangular areas on the basis of the layout data as by step ST4. If the wiring pattern 17 contains lower-level wiring strips 17m and 17n and higher-level wiring strips 17r and 17s, the lower-level wiring strips 17m and 17n and the higher-level wiring strips 17r and 17s are respectively shown in FIGS. 9B and 9C. The lower-level wiring strips 17m and 17n and the lower-level wiring strips 17m and 17n are virtually divided into rectangular areas, and rectangular areas without any overlap are labeled with 17ma, 17mb, 17mc, 17na, 17nb and 17nc, and 17ra, 17rb, 17rc, 17sa, 17sb and 17sc as shown in FIGS. 9D and 9E. Since each of the wiring strips 17m, 17n, 17r and 17s is substantially constant in voltage level, it is unnecessary to sweep throughout the semiconductor large scale integrated circuit with the electron beam pulses 13a as indicated by dash lines 18 in FIG. 9A. For this reason, the computer unit 12a selects one rectangular area from the rectangular areas 17ma to 17mc, 17na to 17nc, 17ra to 17rc or 17sa to 17sc for each wiring strip 17m, 17n, 17r or 17s, and spots 19a, 19b, 19c and 19d are, by way of example, selected for the writing strips 17m, 17n, 17r and 17s, respectively. The computer unit 12a memorizes the coordinate of each spot 19a, 19b, 19c or 19d or of the selected rectangular areas as by step ST5, and the stage driver 11i drives the x-y stage 11c in such a manner as to adjust the selected spots to the electron beam pulses 13a. The test pattern generator 11h sequentially supplies a set of test patterns through the test board 11d to the fault-free product, and the secondary electron detector 11f sequentially supplies the detected signals S1 indicative of the intensity of the secondary electron beams 13b from the selected spots to the computer unit 12a. Since the selected spots are roughly equal in number of the component wiring strips of the wiring pattern 17, the radiation of the electron beam pulses 13a is completed within relatively short time period for every test pattern. Since the layout data have been already stored in the memory unit of the computer unit 12a, the computer unit 12a forms image data indicative of a voltage contrast image on the basis of the potential information contained in the detected signals S1 for the fault-free product as by step ST6. The voltage contrast image 20 is displayed on the screen of the display unit 12b together with a navigation image 21 as shown in FIG. 10.

Subsequently, the analyst places a fault product on the test board 11c, and the stage driver 11i drives the x-y stage 11c in such a manner as to adjust the selected spots to the electron beam pulses 13a. The test pattern generator 11h sequentially supplies a set of test patterns through the test board 11d to the fault product, and the secondary electron detector 11f sequentially supplies the detected signals S1 indicative of the intensity of the secondary electron beams 13b from the selected spots to the computer unit 12a. The radiation of the electron beam pulses 13a is also completed within relatively short time period for every test pattern. Since the layout data are common between the fault-free product and the fault product, the computer unit 12a forms image data indicative of a voltage contrast image on the basis of the potential information contained in the detected signals S1 for the fault product as by step ST7.

Thereafter, the computer unit 12a compares the image data of the fault product with the image data of the fault-free product to see whether or not any discrepancy takes place therebetween as by step ST8. If the answer is negative, the computer unit 12a proceeds to the image data produced under another test pattern. On the other hand, the answer is positive, the computer unit 12a specifies the failure origin of the fault product, and reports the failure origin to the analyst as by step ST9.

As will be understood from the foregoing description, the layout image of the wiring pattern is extracted from the fault-free product by using a single test pattern, any person without knowledge of wiring pattern can analyze a fault product. Moreover, since the voltage contrast image is formed by using the detected signals S1 from the selected spots, the radiation of the electron beam pulses is completed within relatively short time period for every test pattern.

Although the sequence illustrated in FIG. 8 carries out the step ST8 before the step 9, the steps ST8 and ST9 are exchangeable to each other. The method implementing the first embodiment previously registers the coordinate of each spot at step ST5, however, the registration or memorization may be carried out after determination of a visual field on the screen. The image of the layout may be compromised with an image of layout of impurity regions produced through an optical microscope. The method may be applied to different stages in a process sequence of fabricating a semiconductor integrated circuit device, and may be effective against trouble in timing and margin.

Second Embodiment

Figure 11:
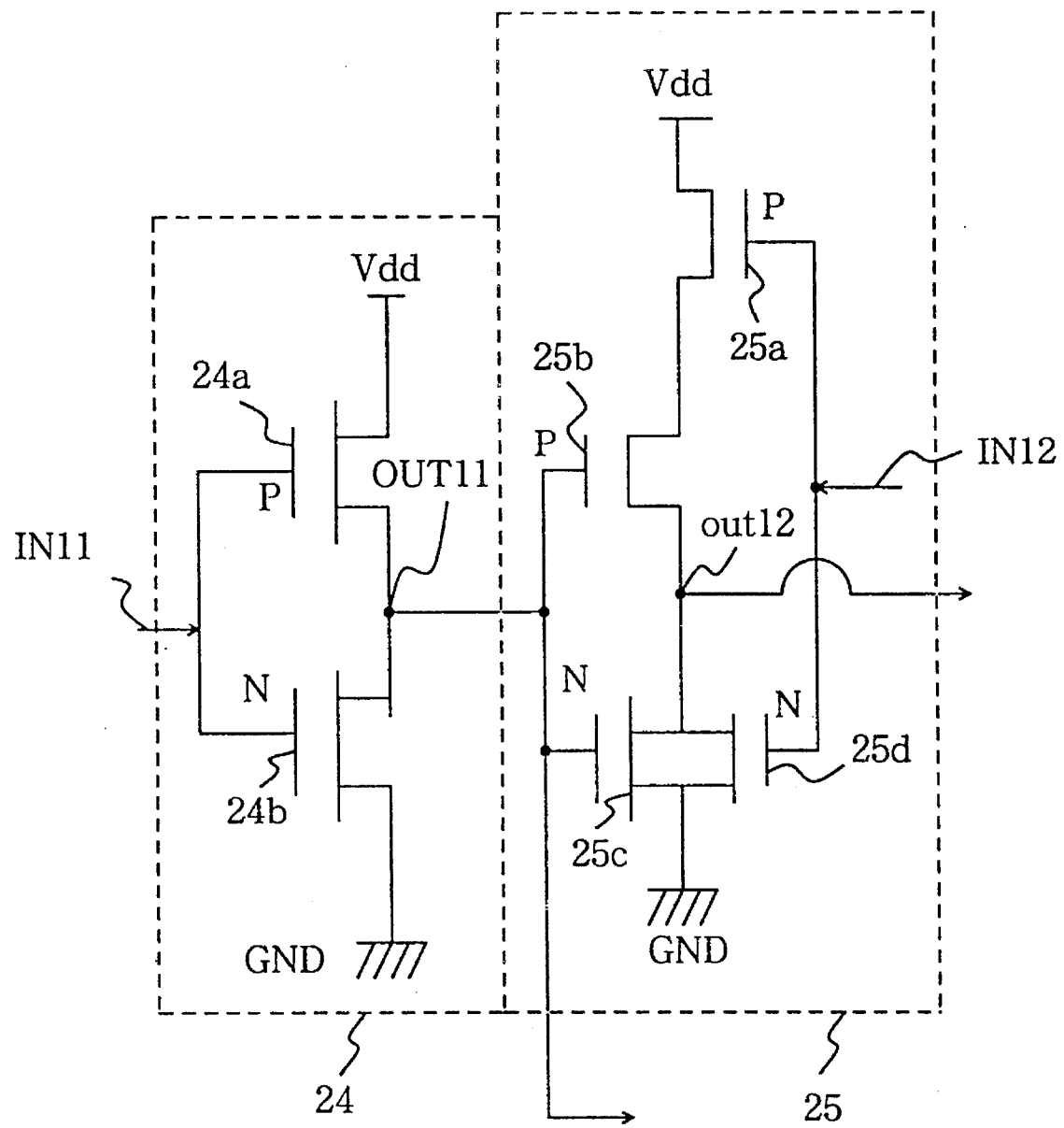
FIG. 11 is a circuit diagram showing the circuit arrangement of an electronic circuit subjected to an analysis implementing a second embodiment.

FIG. 11 shows an electric circuit incorporated in a large scale integrated circuit fabricated on a semiconductor large scale integrated circuit device, and the semiconductor large scale integrated circuit device is subjected to analysis by using a dynamic fault imaging system similar in construction to that shown in FIG. 2. The electric circuit shown in FIG. 11 is implemented by an inverter 24 and a two-input NOR gate 25. The inverter 24 is a series combination of a p-channel enhancement type field effect transistor 24a and an n-channel enhancement type field effect transistor 24b coupled between a power voltage line Vdd and a ground voltage line GND, and a first input signal IN11 is supplied to the gate electrodes of the field effect transistors 24a and 24b. The complementary signal of the input signal IN11 is directly taken out from the output node OUT11 of the inverter circuit 24, and is further supplied to one of the two input nodes of the NOR gate 25. The NOR gate 25 is implemented by a series combination of p-channel enhancement type field effect transistors 25a and 25b coupled between the power voltage line Vdd and an output node OUT12 and a parallel combination of n-channel enhancement type field effect transistors 25c and 25d coupled between the output node OUT12 and the ground voltage line GND. The complementary signal of the input signal IN11 is supplied to the gate electrodes of the field effect transistors 25b and 25c, and another input signal IN12 is supplied to the gate electrodes of the field effect transistors 25a and 25d. The output signal of the NOR gate 25 takes place at the output node OUT12.

Figure 12:
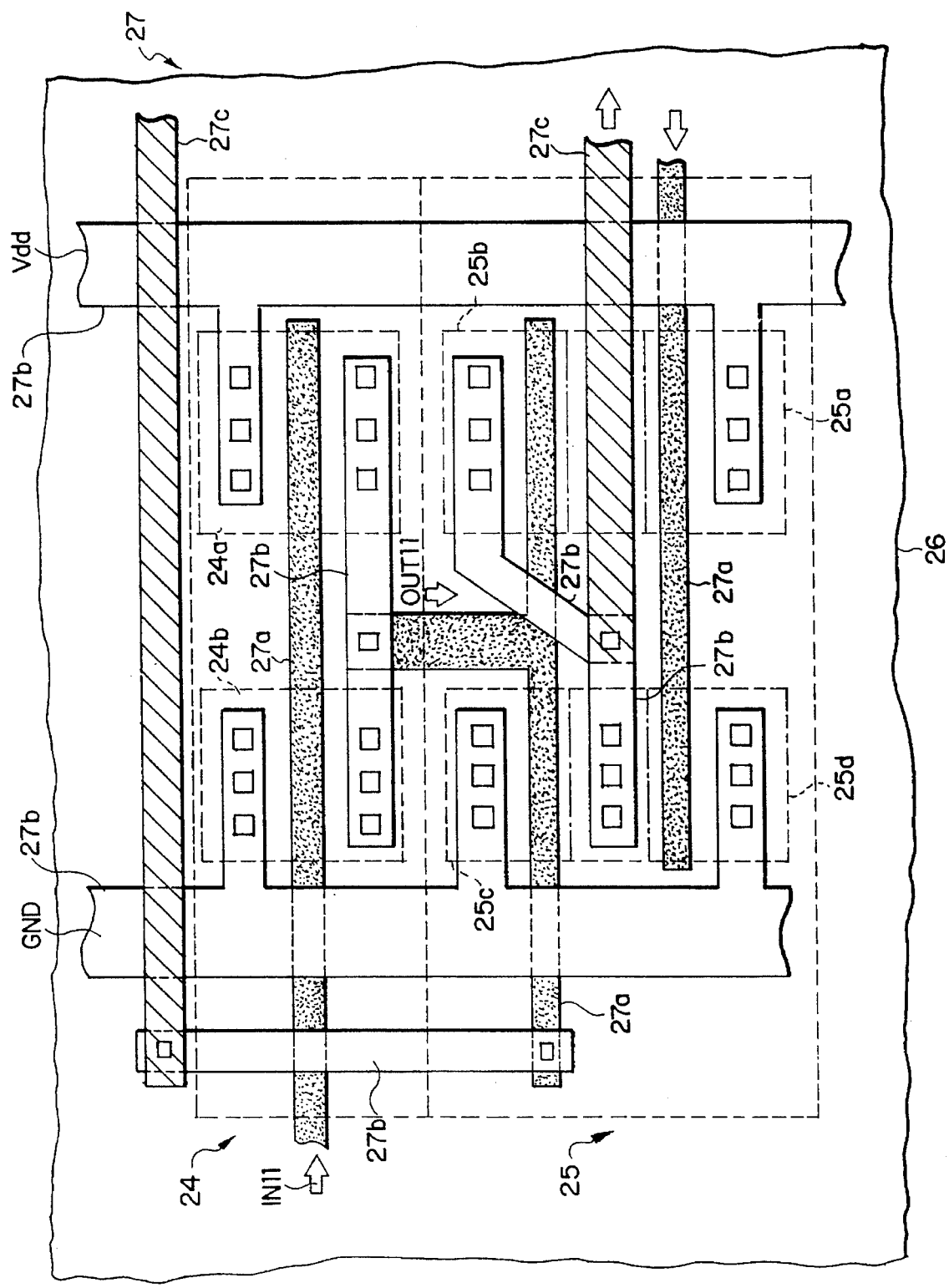
FIG. 12 is a plan view showing the layout of the electronic circuit shown in FIG. 11.

The electric circuit shown in FIG. 11 is fabricated on a semiconductor chip 26, and has a multi-level wiring pattern 27 as shown in FIG. 12. Although inter-level insulating films are deleted FIG. 12 for better understanding, the multi-level wiring pattern 27 has the lowest polysilicon strips 27a, first-level aluminum strips 27b and second-level aluminum strips 27c electrically isolated by means of the inter-level insulating films. In FIG. 12, small dots are applied to the lowest level polysilicon strips 27a, and the second-level aluminum strips 27c are hatched for the sake of better discrimination. Small boxes are indicative of locations of contact holes for interconnecting conductive strips on different levels.

Figure 13:
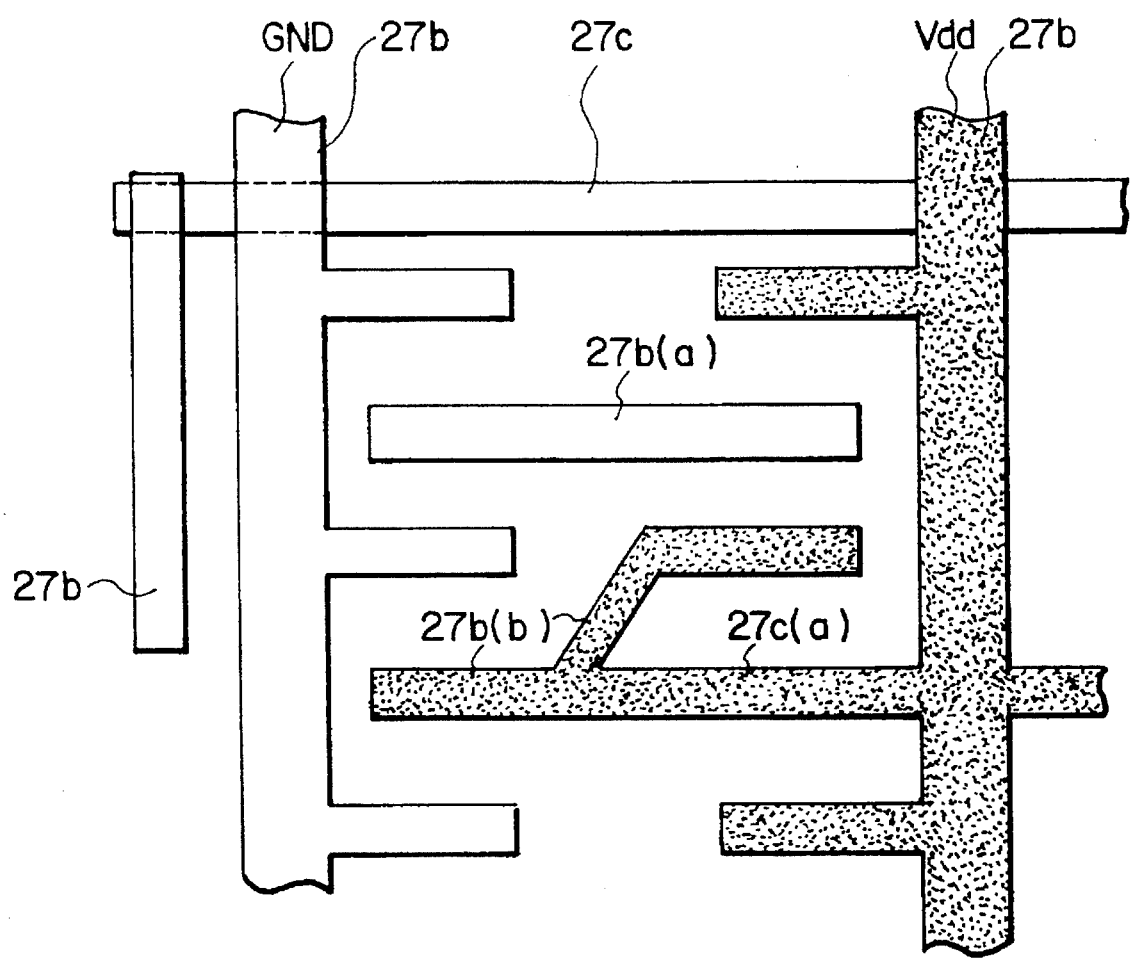
FIG. 13 is a plan view showing an image of voltage contrast produced from the layout shown in FIG. 11.

The semiconductor large scale integrated circuit device thus arranged is placed on a test board associated with a test pattern generating unit, and an electron beam projector radiates electron beam pulses under the control of a beam pulse controller. Upon radiation of the electron beam pulses, the semiconductor large scale integrated circuit device produces secondary electrons, and the secondary electrons are detected by a secondary electron detector. A detected signal indicative of the intensity of the secondary electron beams is supplied to a data processor forming a part of the dynamic fault imaging system, and the intensity of the secondary electrons is indicative of voltage level of a wiring strip of the multi-level wiring pattern 27 as well as of the depth of the wiring strip measured from the top surface of the semiconductor large scale integrated circuit device. If a test pattern supplied from the test pattern generator has the input signal IN11 of the high voltage level and the input signal IN12 of the low voltage level, the inverter circuit 24 produces the complementary signal of the low voltage level, and the complementary signal of the low voltage level is NORed with the input signal IN12 of the low voltage level for producing the output signal OUT12 of the high voltage level. When the NOR operation is completed, the potential levels of all the strip 27a, 27b and 27c are determined, and the input signal IN11 of the high voltage level and the input signal IN12 of the low voltage level cause the strips 27b and 27c to have the respective potential levels as shown in FIG. 13. In FIG. 13, the low or the ground voltage level GND is indicated in white, and the high or the power voltage level Vdd are indicated in black. However, the polysilicon strips 17a are deleted from FIG. 13 for the sake of simplicity. Since the first-level aluminum strip 27b(a) propagates the complementary signal of the ground voltage level, the first-level aluminum strip 27b(a) is indicated in white. However, the first-level aluminum strip 27b(b) supplies the power voltage level from the p-channel enhancement type field effect transistor 25b to the n-channel enhancement type field effect transistors 25c and 25d as well as to the second-level aluminum strip 27c(a), the first-level aluminum strip 27b(b) and the second-level aluminum strip 27c(a) are indicated in black. Thus, the first-level aluminum strips 27b(a) and 27b(b) are equal in depth and different in potential level, and the secondary electron beams for the first-level aluminum strips 27b(a) and 27b(b) are different in intensity because of the attractive force exerted on the secondary electrons. Moreover, since the first-level aluminum strip 27b(b) and the second-level aluminum strip 27c(a) are equal in potential level and different in depth, the secondary electron beams for the first-level aluminum strip 27b(b) and the second-level aluminum strip 27c(a) are also different in the intensity.

Therefore, while the strips 27a, 27b and 27c shown in FIG. 12 are in the high potential level, the secondary electron beams are in relatively low intensity range. However, if the strips 27a, 27b and 27c are decreased in the potential level, the secondary electron beams are shifted to relatively high intensity range. This means that the secondary electron beam contains not only potential information but also topographic information.

Figure 14:
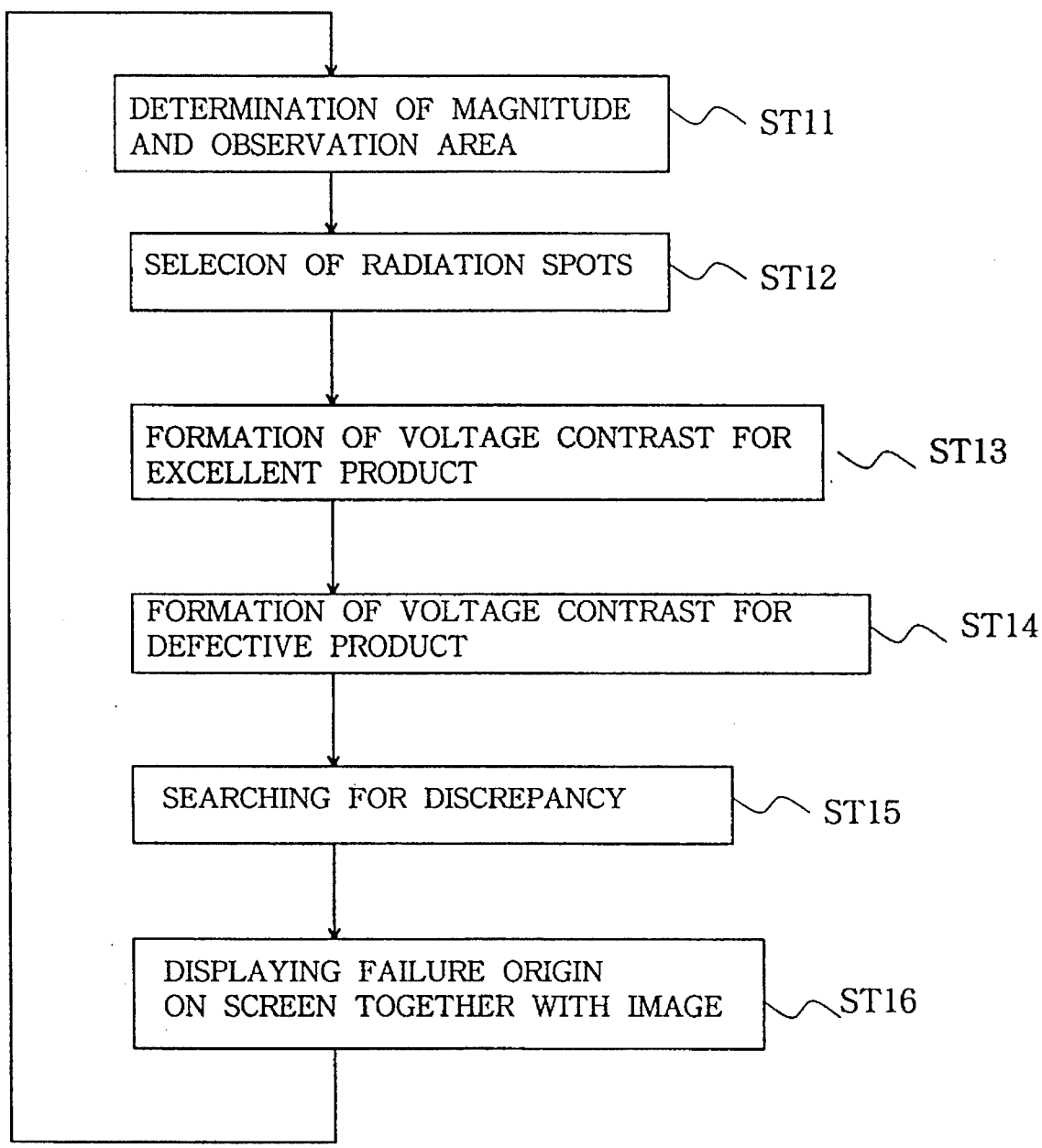
FIG. 14 is a flow chart showing the sequence of the analysis implementing the second embodiment.

Description is hereinbelow made on a sequence of analysis with reference to FIG. 14. The sequence of a method implementing the second embodiment starts with preparation of an excellent semiconductor large scale integrated circuit device and a defective semiconductor large scale integrated circuit device. Both excellent and defective semiconductor integrated circuit devices are of the type described hereinbefore with reference to FIGS. 11 to 13. Layout data are produced from a mask design specification for determining the layout of the wiring pattern 27, and an observation area and magnitude thereof are automatically or manually selected from the layout data of the wiring pattern 27 as by step ST11. The mask design specification describes and illustrates a set of mask plates using in a fabrication process of said excellent and defective large scale integrated circuit devices. The observation area is displayed on the screen of the display unit associated with the computer unit at the appropriate magnification.

Subsequently, radiation spots are selected from the wiring pattern 27 of the excellent semiconductor large scale integrated circuit device as by step ST12, and the selection of the radiation spots is illustrated in FIGS. 14A and 14B. FIG. 15A shows the first-level aluminum strips 27b, and FIG. 15B shows the second-level aluminum strips 27c. Since each wiring strip 27b or 27c is uniform in voltage level, only one spot is designated on every wiring strip 27b or 27c as one of the radiation spots, and, for this reason, the first-level aluminum wiring strips 27b and the second-level aluminum wiring strips 27c have respective radiation spots 271 to 275 and 276 to 277. However, any spot of the first-level wiring strips 27b under the second-level aluminum wiring strips 27c is not available as one of the radiation spots 271 to 275.

Figure 16:
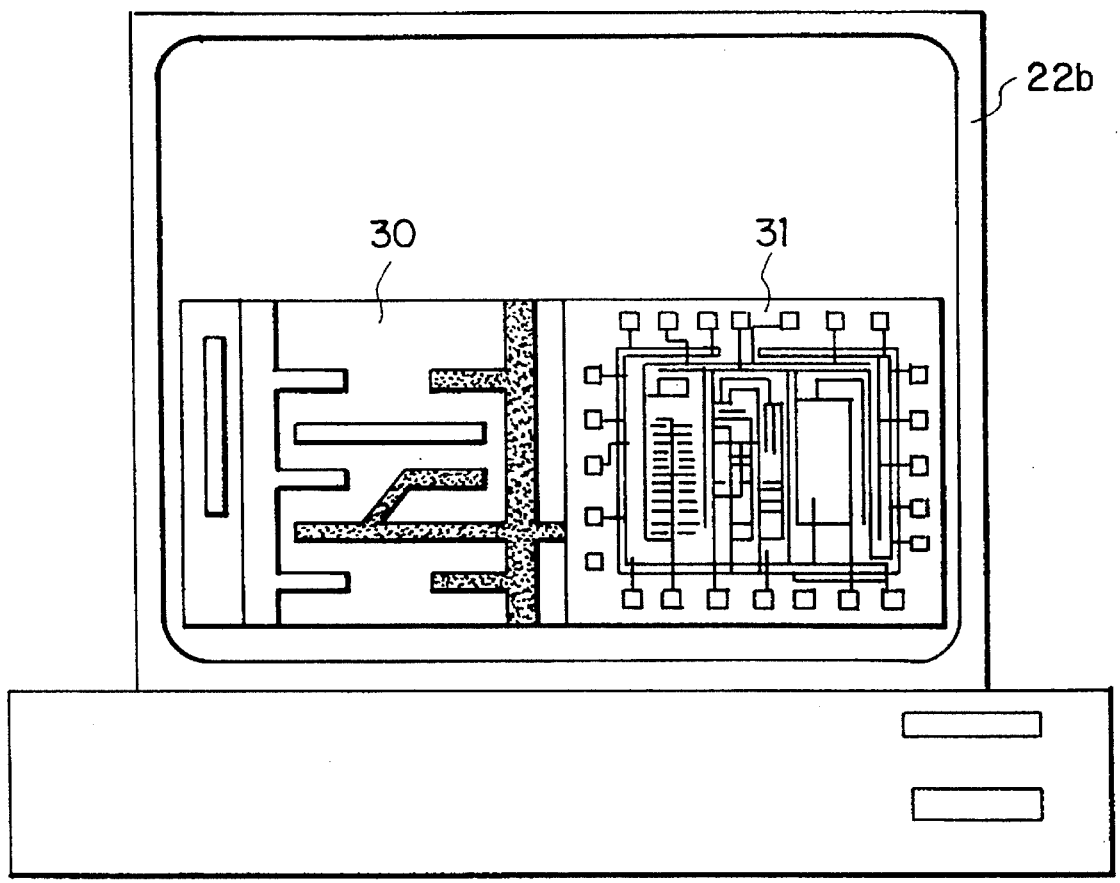
FIG. 16 is a front view showing the image of layout together with the image of voltage contrast on a screen of a display unit.

After the selection of the radiation spots 271 to 277, the electron beam pulses are sequentially radiated onto the radiation spots 271 to 277 of the excellent semiconductor large scale integrated circuit device, and the secondary electrons are detected by the secondary electron detector. The intensity of the secondary electrons is varied with the potential level of the radiation spots 271 to 277 as well as the depth thereof, and the secondary electron detector supplies a detected signal indicative of the intensity of the secondary electrons to the computer unit. Since the layout data have been already stored in a memory unit of the computer unit, only potential information is extracted from the detected signal, and an image of potential contrast is formed for the excellent semiconductor integrated circuit device as by step ST13. The image of voltage contrast 30 may be displayed in different colors on the screen of the display unit together with the image of the layout 31 as shown in FIG. 16. In this instance, the electron beam pulses are radiated onto the radiation spots 271 to 277, and the image 30 is formed without short time period in comparison with the prior art all-over scanning. In fact, the prior art method requires spot radiation onto 250×250 points, however, the method implementing the second embodiment radiates the electron beam pulses onto only seven spots.

Subsequently, the defective semiconductor large scale integrated circuit device is placed on the test board of the tester, and electron beam pulses are radiated onto the radiation spots 271 to 277 of the defective semiconductor large scale integrated circuit device. The defective semiconductor large scale integrated circuit device produces secondary electrons, and the intensity of the secondary electrons is similarly varied with the potential level of the radiation spots 271 to 277 as well as with the depth of the radiation spots. The potential information is extracted from the detected signal, and an image of voltage contrast is formed for the defective semiconductor large scale integrated circuit device as by step ST14. The computer unit compares the voltage contrast of the defective semiconductor large scale integrated circuit device with the voltage contrast of the excellent semiconductor large scale integrated circuit device, and searches for discrepancy as by step ST15. If there is discrepancy, the discrepancy is indicative of an failure origin such as, for example, disconnection or leakage, and the failure origin is displayed on the image of layout 30 as by step ST16. However, if there is not any discrepancy, the system repeats the steps ST11 to ST15 by changing the test pattern applied to the excellent and defective semiconductor large scale integrated circuit devices until the computer unit finds a failure origin.

Figure 17:
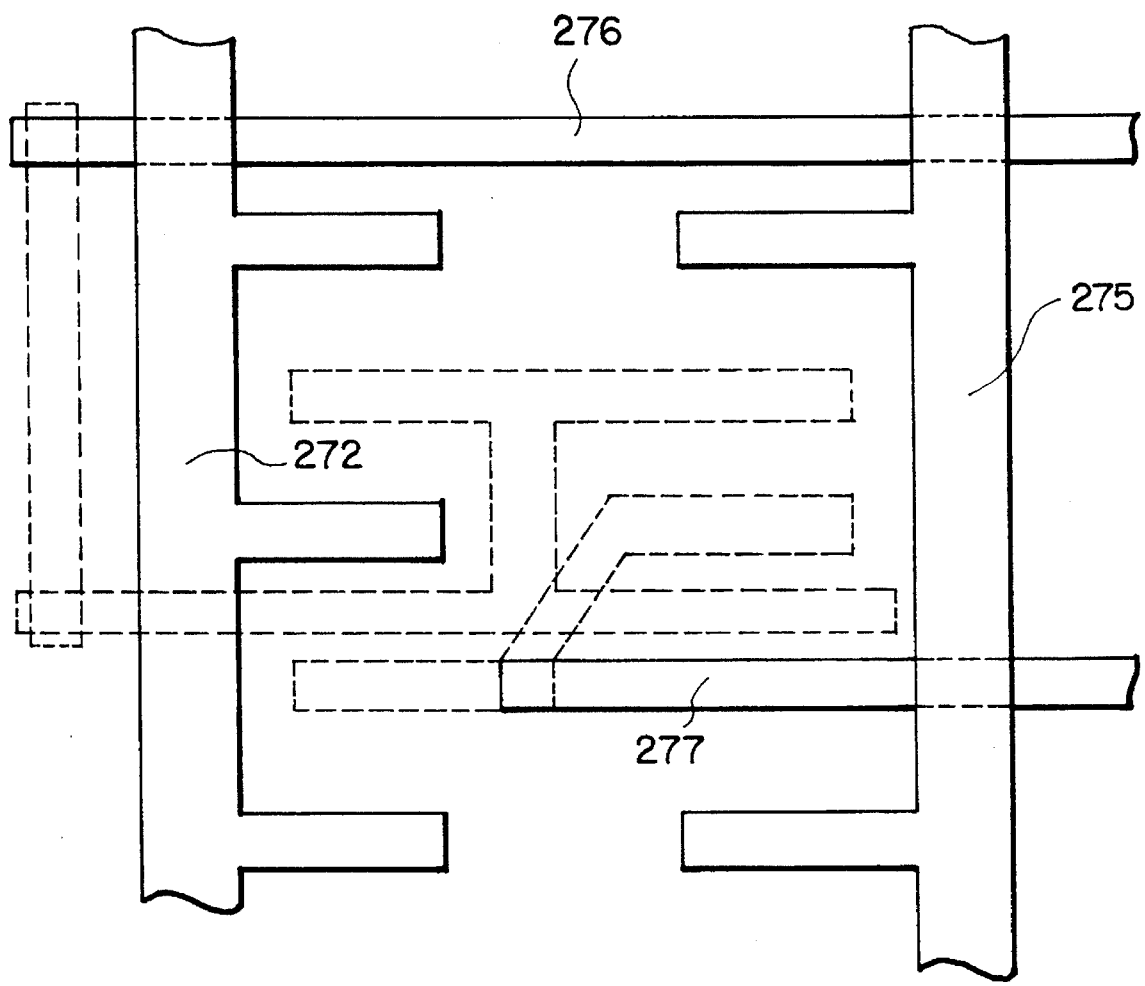
FIG. 17 is a plan view showing radiation spots to be decreased for speed-up.

The sequence implementing the second embodiment selects one spot from every wiring strip as described hereinbefore. However, wiring strips coupled with one another are equal in voltage level, and radiation spots may be decreased as shown in FIG. 17. The radiation spots 273, 271 and 276 are coupled with one another, and only radiation spot 276 is radiated with the electron beam pulses. Similarly, the radiation spots 274 and 277 are coupled with each other, and only the radiation spot 277 is radiated with the electron beam pulses. Therefore, the radiation spots are decreased to only four spots 272, 275, 276 and 277, and the steps ST13 and ST14 are completed within shorter time period rather than the sequence described hereinbefore.

Third Embodiment

Figure 18:
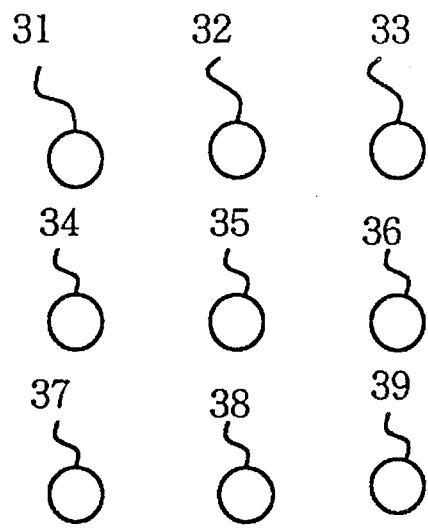
FIG. 18 is a plan view showing radiation spots for yet another method of analyzing a fault according to the present invention.

Yet another sequence of a method of analyzing a fault starts with preparation of an excellent semiconductor large scale integrated circuit device as well as of a defective semiconductor large scale integrated circuit device. Radiation spots with electron beam pulses are selected in such a manner as to form a lattice structure as shown in FIG. 18.

Figure 19:
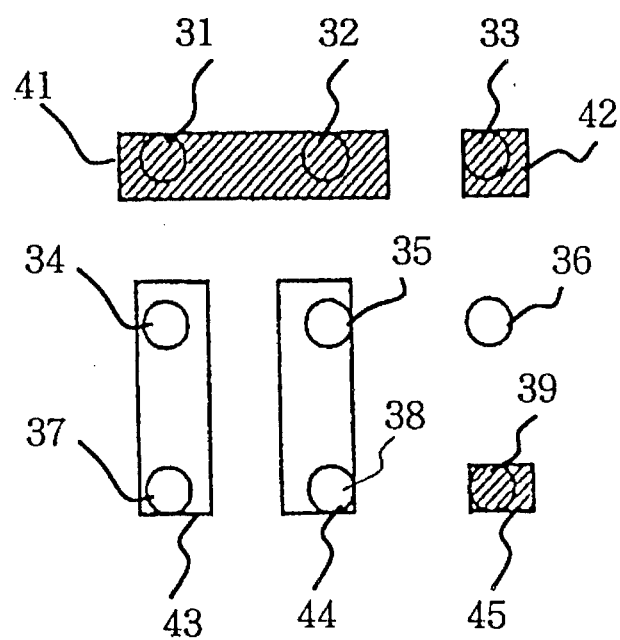
FIG. 19 is a plan view showing the radiation spots over palled with wiring strips.

The radiation spots 31 to 39 respectively take the lattice points of the lattice structure, and each of the radiation spots 31 to 39 is spaced apart from adjacent radiation spots by length approximately equal to an average distance between two adjacent wiring strips. If one of the radiation spots 31 to 39 is regulated to be coincidence with one of the wiring strips 41 to 45, most of the radiation sports 31 to 39 thus arranged are located on wiring strips 41 to 45 of a wiring pattern as shown in FIG. 19, and the radiation with the electron beam pulses consumes a smaller amount of time than the prior art all-over scanning radiation. In fact, the prior art allover scanning radiation consumes one hundred times as long as the spot radiation of the third embodiment.

Figure 20:
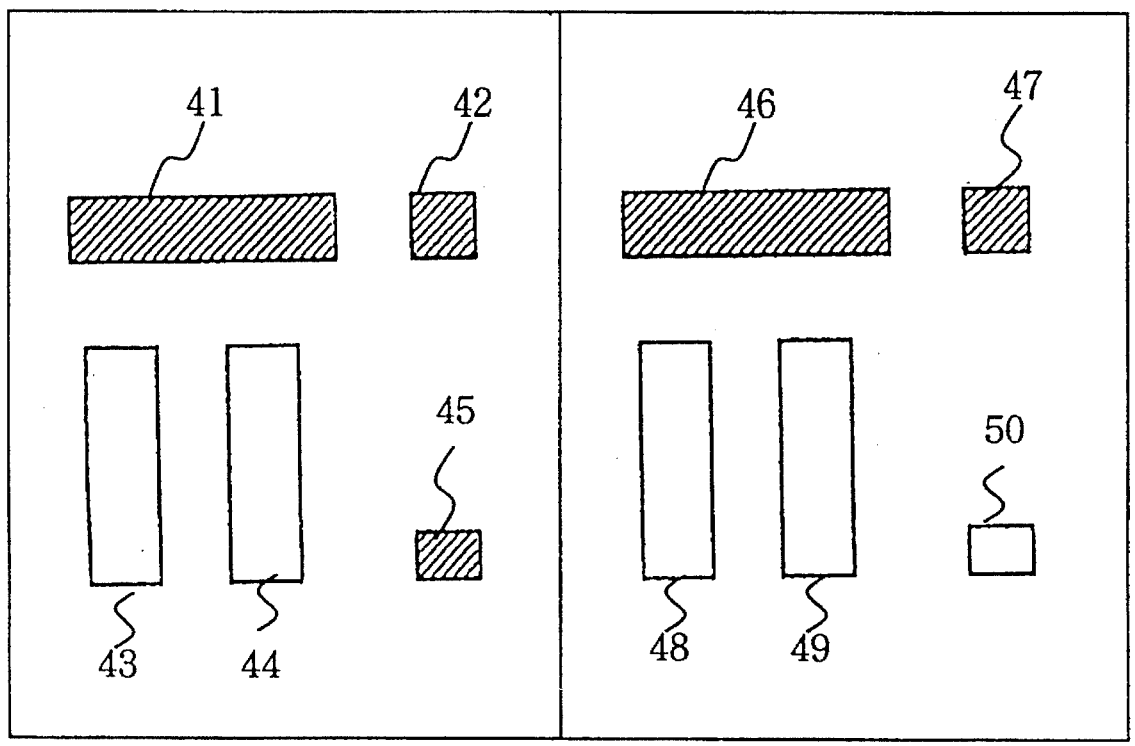
FIG. 20 is a plan view showing an image of voltage contrast of the wiring strips incorporated in an excellent product compared with an image of voltage contrast of the wiring strips incorporated in a defective product.

After the selection of the radiation spots 31 to 39, the electron beam pulses are sequentially radiated onto the radiation spots 31 to 39 of the excellent semiconductor large scale integrated circuit device under application of a test pattern, and the secondary electrons are detected by a secondary electron detector. In this instance, the test pattern causes the wiring strips 41, 42 and 45 to be in a high voltage level and the wiring strips 43 and 44 to be in a low voltage level. The wring strips 41, 42 and 45 in the high voltage level are hatched in FIG. 19 for easy discrimination. The intensity of the secondary electrons is varied with the potential level of the radiation spots 31 to 39 as well as the depth thereof, and the secondary electron detector supplies a detected signal indicative of the intensity of the secondary electrons to the computer unit. Potential information is extracted from the detected signal, and an image of potential contrast is formed for the excellent semiconductor integrated circuit device as shown in FIG. 20. The image of voltage contrast is displayed in different colors in the left side area on the screen of a display unit as show in FIG. 20.

Subsequently, the defective semiconductor large scale integrated circuit device is placed on the test board of the tester, and electron beam pulses are radiated onto the radiation spots 31 to 39 of the defective semiconductor large scale integrated circuit device under the application of the same test pattern. The defective semiconductor large scale integrated circuit device produces secondary electrons, and the intensity of the secondary electrons is similarly varied with the potential level of the radiation spots 271 to 277 as well as with the depth of the radiation spots. The potential information is extracted from the detected signal, and an image of voltage contrast is formed for the defective semiconductor large scale integrated circuit device. The defective semiconductor large scale integrated circuit device has the same wiring pattern as the excellent semiconductor large scale integrated circuit device, and the test pattern contains wiring strips 46 to 50 respectively corresponding to the wiring strips 41 to 45. The image of voltage contrast of the defective semiconductor large scale integrated circuit device is displayed in the right side area on the screen as will be seen from FIG. 20. Since only the wring strips 46 and 47 are in the high voltage level, hatching lines are applied to the wiring strips 46 and 47 only.

The computer unit compares the voltage contrast of the defective semiconductor large scale integrated circuit device with the voltage contrast of the excellent semiconductor large scale integrated circuit device, and searches for discrepancy. If there is no discrepancy, the system repeats the sequence by changing the test pattern applied to the excellent and defective semiconductor large scale integrated circuit devices until the computer unit finds a failure origin. Comparing the images on the screen, discrepancy takes place at the radiation spot 39 as summarized in Table 1, and the discrepancy is indicative of an failure origin such as, for example, disconnection or leakage.

TABLE 1

| | Spot No. | | | | | | | | |
|---|---|---|---|---|---|---|---|---|---|
| | 31 | 32 | 33 | 34 | 35 | 36 | 37 | 38 | 39 |
| excellent | H | H | H | L | L | * | L | L | H |
| defective | H | H | H | L | L | * | L | L | L |

In Table 1, the radiation spot 36 is out of consideration, and is indicated by *, because the radiation spot 36 is not overlapped with any wring strip.

In the above description, the length between adjacent radiation spots is adjusted to the average distance between two wiring strips. However, the length may be 1/n of the average distance where n is a natural number. If the length between the adjacent radiation spots is adjusted to 1/n of the average distance, some of the radiation spots are not fallen onto any wring strips, and the intensity of the secondary electrons is indicative of the background of the wiring patter. However, the background makes the wiring pattern clear, and is different between the excellent semiconductor large scale integrated circuit device and the defective semiconductor large scale integrated circuit device. Therefore, the background is conductive to enhancement of accuracy of the analysis.

On the other hand, the length between the adjacent radiation spots may be m/n times larger than the average distance where m is a natural number greater than n. If the length is adjusted to m/n of the average distance, some wiring strips may not be covered with the lattice structure of the radiation spots. However, if all-over layout pattern of a semiconductor large scale integrated circuit device is roughly searched for a failure origin by using the length at m/n, the important observation area is rapidly determined, and, thereafter, the important observation area is strictly searched by using the length at 1/n. This results in not only enhancement of accuracy but also speed-up.

Figure 21:
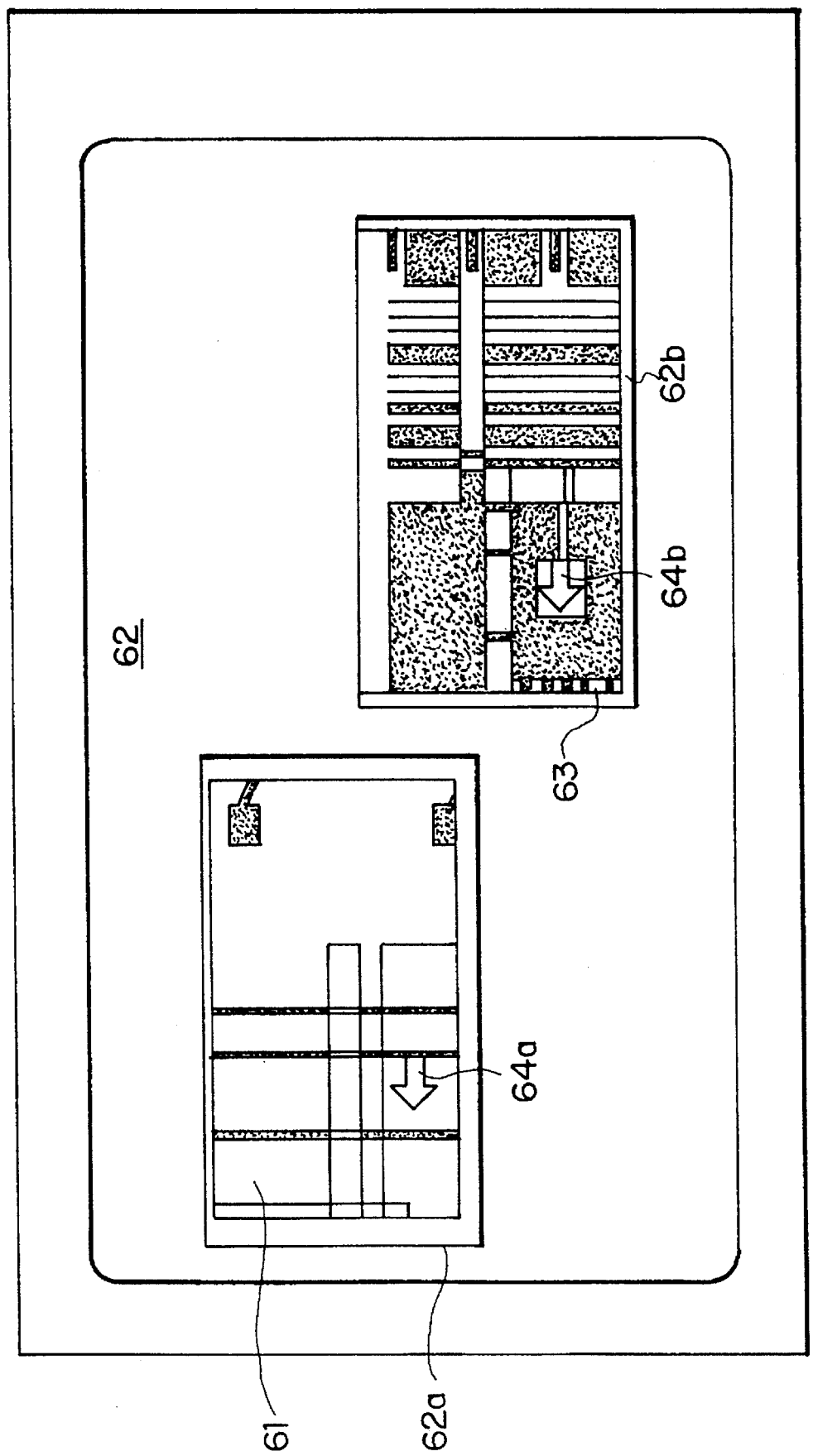
FIG. 21 is a front view showing a screen of a display unit where a voltage contrast image and an optical microscopic image are displayed.

In a dynamic fault imaging system, images of voltage contrast are displayed on the screen. However, one of the image of voltage contrast may be simultaneously displayed together with an optical microscopic image, and one of the images of voltage contrast formed through any one of the embodiments or the image of voltage contrast formed through the prior art technique is available for the simultaneous displaying. For example, as shown in FIG. 21, an image of voltage contrast 61 is displayed on a window 62a defined in a screen 62 of a display unit, and an optical microscopic image corresponding to the image 61 is simultaneously displayed in another window defined in the same screen 62. Pointers 64a and 64b are respectively movable in the windows 62a and 62b, and are linked with each other. When the pointer 64a is manually moved by means of, for example, a mouse (not shown) so as to indicate a particular spot of the image 61, the other pointer 64b is automatically moved to the corresponding spot of the optical microscopic image. The relation between the pointers 64a and 64b are exchangeable. Namely, if the pointer 64b is manually moved to a particular spot, the pointer 64a is automatically moved to the corresponding spot on the image of voltage contrast. With these pointers, one of the images 61 and 63 navigates the fault analysis.

Figure 22:
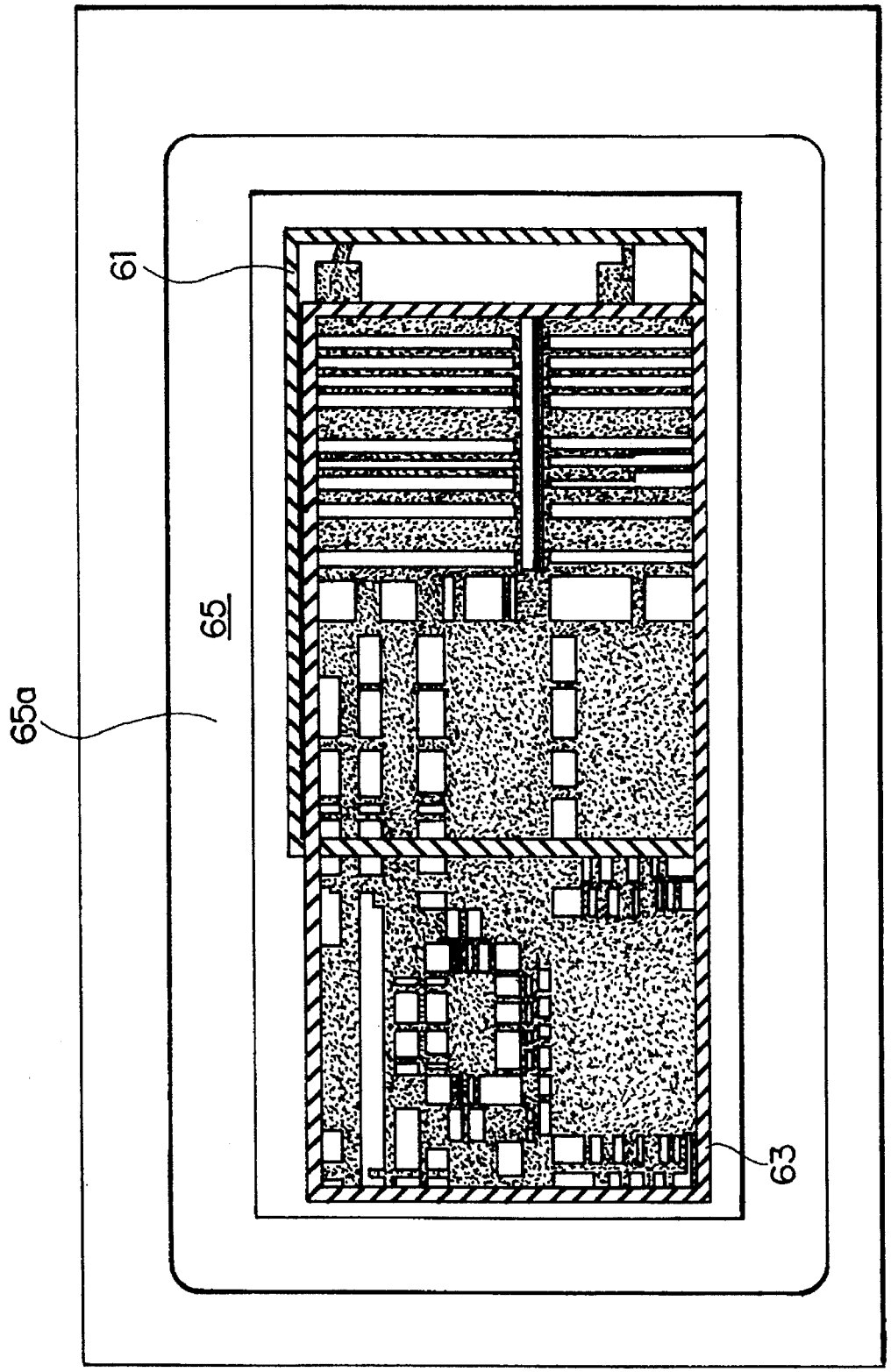
FIG. 22 is a front view showing a screen of a display unit where a voltage contrast image is overlapped with an optical microscopic image.

The image of voltage contrast 61 may be overlapped with the optical microscopic image 63 as shown in FIG. 22 in a window 65a of a screen 65 of a display unit, and the image of voltage contrast 61 may be semi-transparent so as to allow an analyst to see both images 61 and 63. The images thus overlapped allow the analyst to easily specify a failure origin on the screen 65.

Figure 23A:
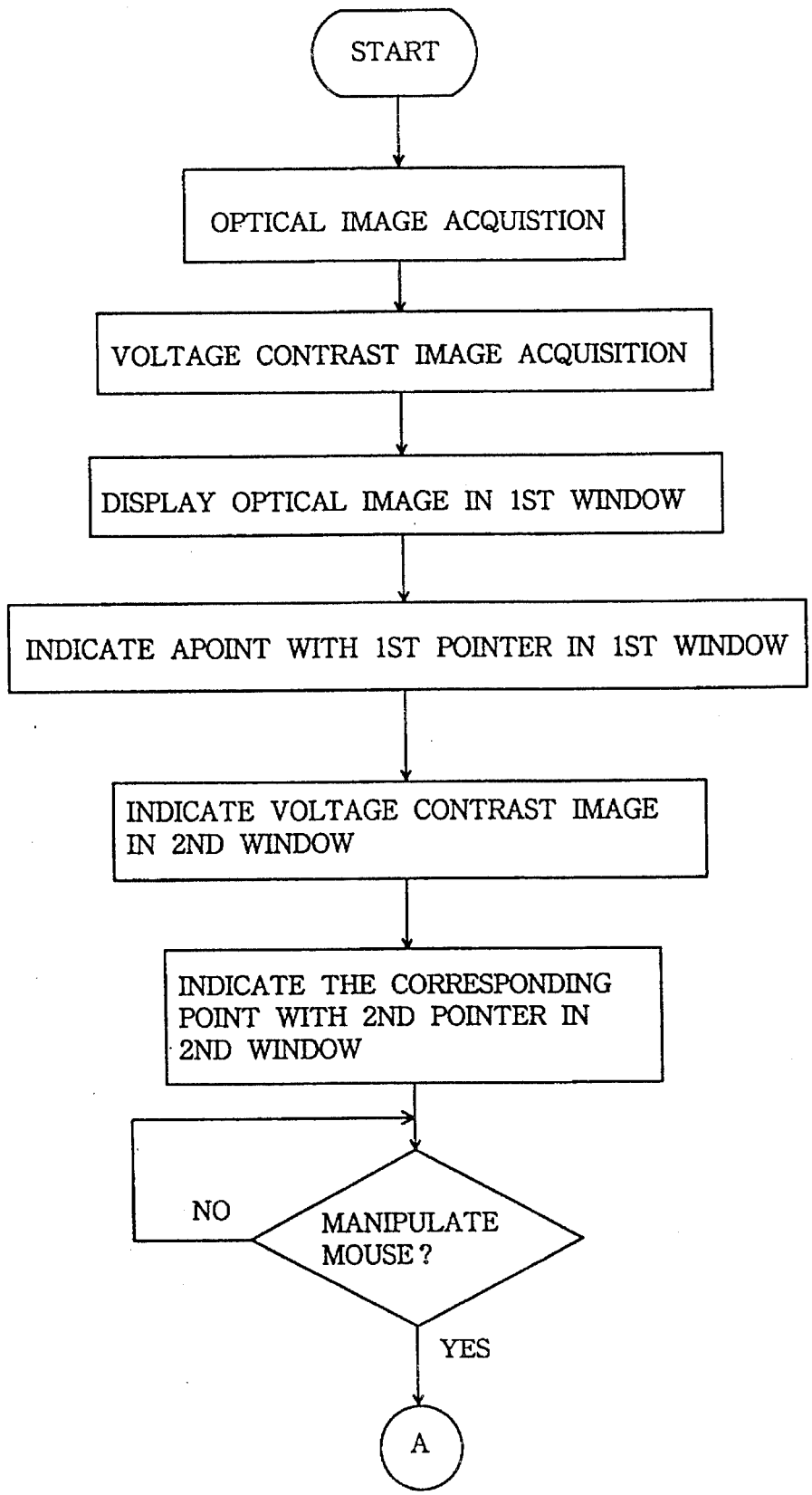
FIGS. 23A and 23B are flow-charts showing a sequence executed by a computer unit.
Figure 23B:
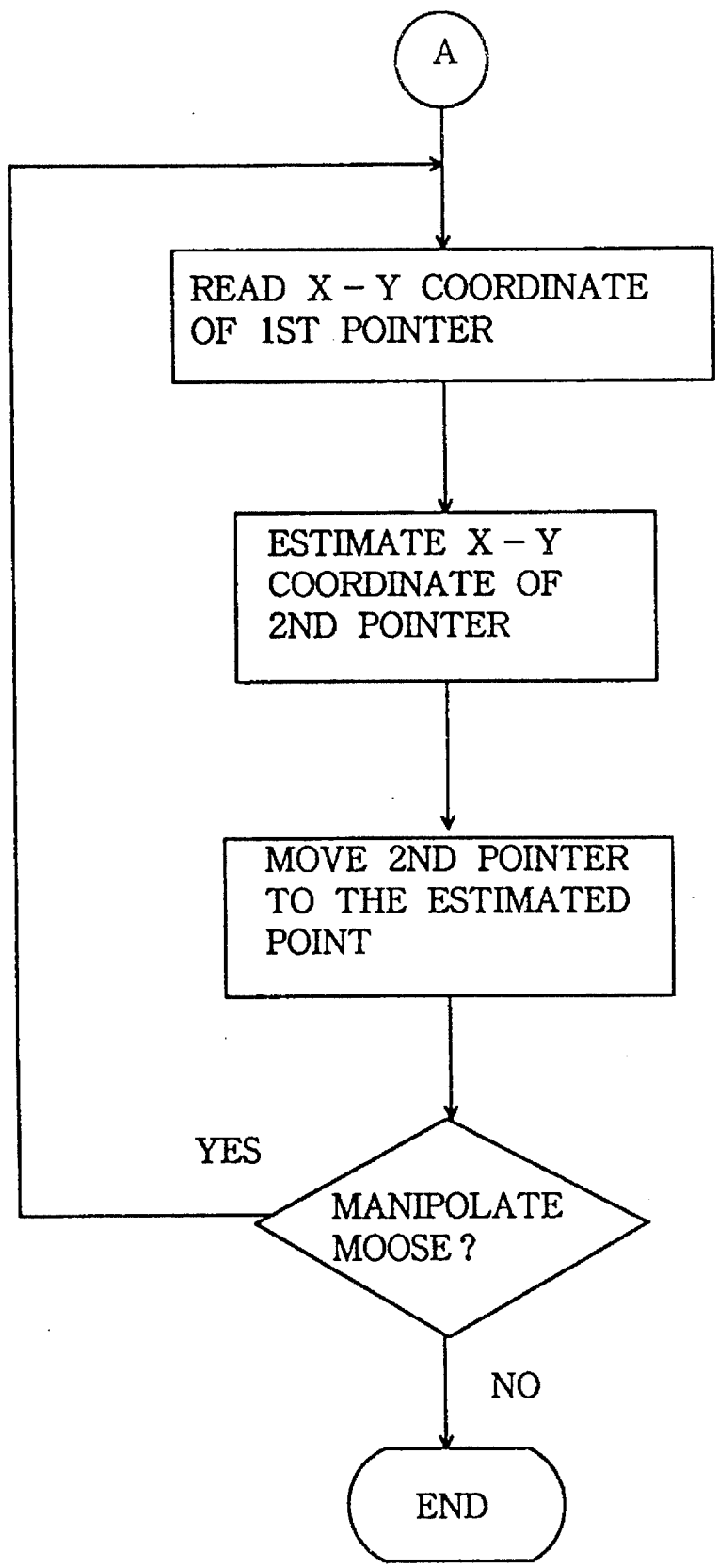

FIGS. 23A and 23B illustrate a sequence of a simultaneous displaying. First, a computer unit acquires an optical image through, for example, an image reader, and stores the image data in appropriate memory locations as a data base. The computer unit further acquires a voltage contrast image, and temporally stores other image data in other memory locations. The computer unit displays the optical image in a first window on a screen of an associated display unit, and further display a first pointer in the first window. The computer unit further displays the voltage contrast image in a second window on the screen of the associated display unit, and a second pointer is also displayed in the second window. In this stage, both optical and voltage contrast images are simultaneously displayed together with the first and second pointers as shown in FIG. 21.

The computer unit waits for an instruction from a mouse. Namely, the computer unit monitors an input signal from the mouse to see if the mouse is manipulated or not. If the answer is negative, the computer unit continues to monitor the input signal from the mouse. However, if the answer is affirmative, the computer unit reads the x-y coordinate of the first pointer to be moved, and estimates the x-y coordinate corresponding to the first pointer to be moved. In accordance with the x-y coordinate to be estimated, the computer unit moves the second pointer in the second window to the new point, and monitors the input signal from the mouse to see if or not the first pointer is further moved. If the first pointer is further moved, the computer unit repeats the reading step for the first pointer to the moving step until the voltage contrast image is replaced with another voltage contrast image.

Figure 24A:
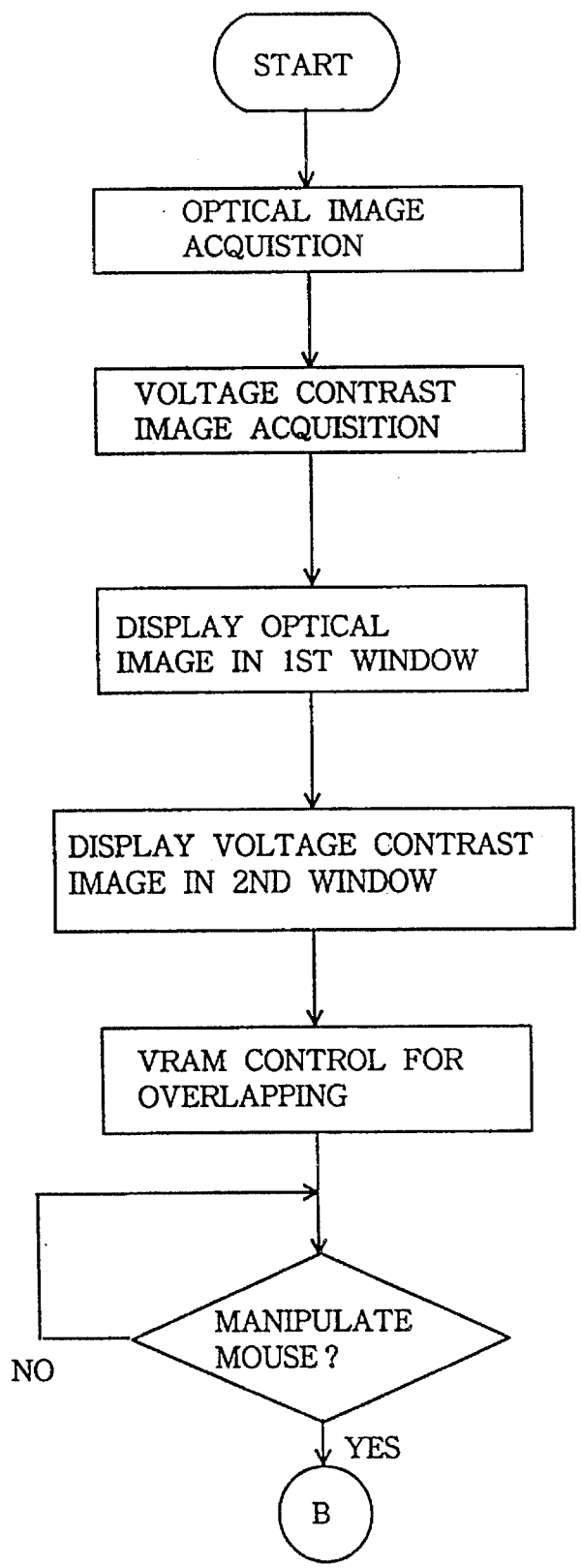
FIGS. 24A and 24B are flow-charts showing another sequence executed by a computer unit.
Figure 24B:
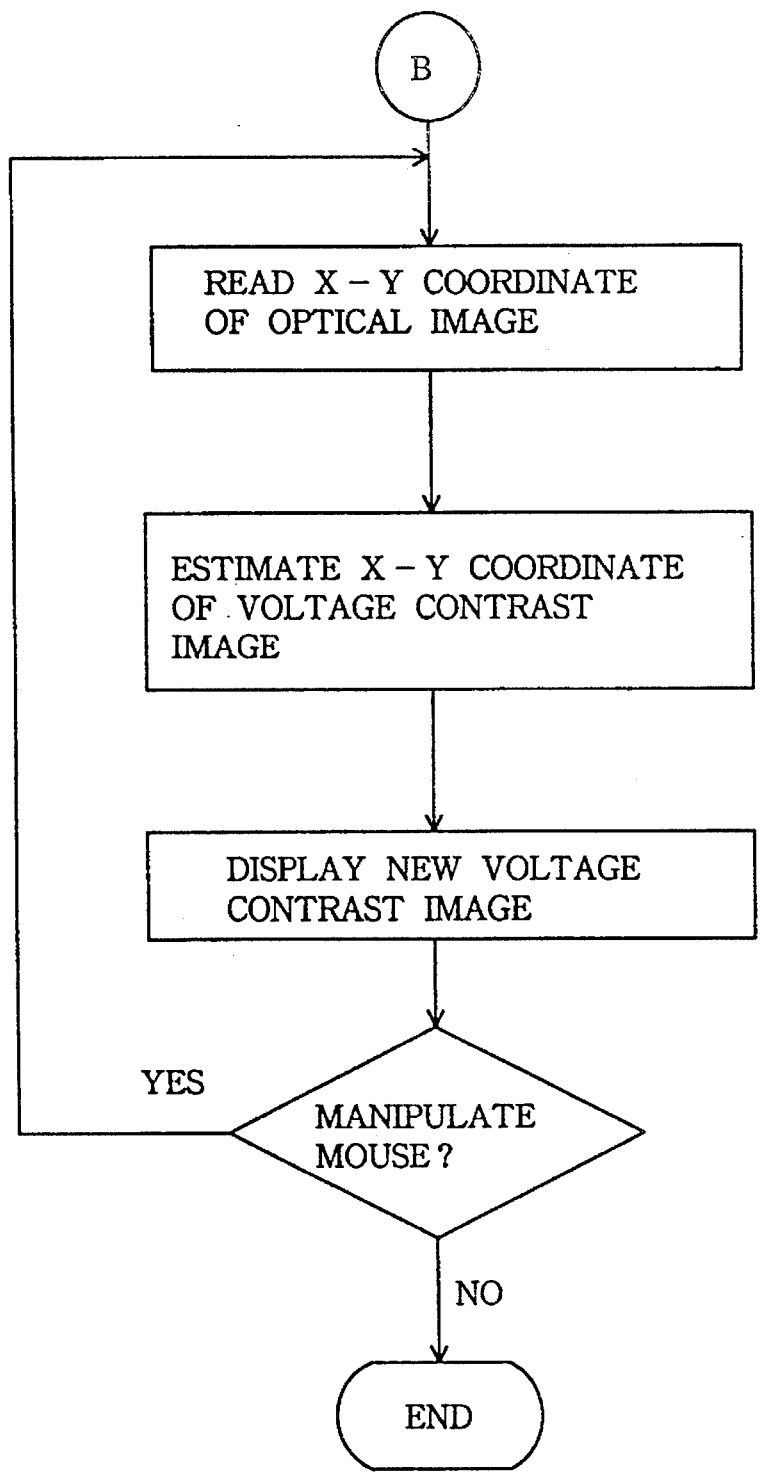

FIGS. 24A and 24B illustrate a sequence of overlapping. A computer unit acquires an optical image through, for example, an image reader, and stores the image data in appropriate memory locations as a data base. The computer unit further acquires a voltage contrast image, and temporally stores other image data in other memory locations. The computer unit displays the optical image in a first window on a screen of an associated display unit, and further display the voltage contrast image in a second window on the screen of the associated display unit. In this stage, both optical and voltage contrast images are simultaneously displayed in the respective windows on the same screen. However, the optical image and the voltage contrast image may not be displayed in the separate windows. Subsequently, the computer unit arranges the image data for both optical and voltage contrast images so as to display these images in overlapped manner as shown in FIG. 22.

The computer unit waits for an instruction from a mouse. Namely, the computer unit monitors an input signal from the mouse to see if the mouse is manipulated or not. If the answer is negative, the computer unit continues to monitor the input signal from the mouse. However, if the answer is affirmative, the computer unit reads the x-y coordinate of the optical image to be moved, and estimates the x-y coordinate corresponding to the optical image to be moved. In accordance with the x-y coordinate to be estimated, the computer unit moves the voltage contrast image to keep the voltage contrast image in the overlapped manner with the optical image, and monitors the input signal from the mouse to see if or not the first pointer is further moved. If the first pointer is further moved, the computer unit repeats the reading step for the optical image to the moving step until the image of voltage contrast is discarded.

Although particular embodiments of the present invention have been shown and described, it will be obvious to those skilled in the art that various changes and modifications may be made without departing from the spirit and scope of the present invention.

What is claimed is:

1. A method of analyzing a fault, comprising the steps of:

a) preparing a fault-free semiconductor integrated circuit device, a test semiconductor integrated circuit device and a layout pattern of multi-level wiring strips common to said fault-free and test semiconductor integrated circuit devices;

b) determining radiation spots on at least two wiring strips, respectively, of said multi-level wiring strips, said at least two wiring strips being different in depth from one another, and said determined radiation spots being able to be exposed to a radiation of a beam and being spaced apart from one another;

c) radiating an electron beam onto each of said determined radiation spots of said fault-free semiconductor integrated circuit device under application of a test pattern for allowing a first secondary electron beam to be produced at said determined radiation spots of said fault-free semiconductor integrated circuit device, the intensity of said first secondary electron beam being variable with a voltage level of said multi-level wiring strips and the depth of the wiring strips, and the intensity of said first secondary electron beam being measured;

d) a first forming step of forming an image of voltage contrast of said multi-level wiring strips of said fault-free semiconductor integrated circuit device from the measured intensity of said first secondary electron beam;

e) radiating electron beams onto said determined radiation spots of said test semiconductor integrated circuit device under application of said test pattern for allowing a second secondary electron beam to be produced at said determined radiation spots of said test semiconductor integrated circuit device, the intensity of said second secondary electron beam being variable with a voltage level and the depth of the wiring strips of said multi-level wiring strips of said test semiconductor integrated circuit device, and the intensity of said second secondary electron beam being measured;

f) a second forming step of forming an image of voltage contrast of said multi-level wiring strips of said test semiconductor integrated circuit device from the measured intensity of said second secondary electron beam; and g) comparing said image of voltage contrast formed for said test semiconductor integrated circuit device with said image of voltage contrast formed for said fault-free semiconductor integrated circuit device so as to search for a discrepancy indicative of a failure origin of said test semiconductor integrated circuit device, and wherein said second forming step includes forming said image from the measured intensity of said second secondary electron beam such that said formed image is indicative of the topography of said test semiconductor integrated circuit device.

2. A method of analyzing a fault as set forth in claim 1, in which an optical image of said layout pattern and said image of voltage contrast for said [defective] test semiconductor integrated circuit device are displayed in respective windows on a screen of a display unit, first and second pointers to be linked with each other being further displayed in said respective windows for navigating an analyst.

3. The method as defined in claim 1, wherein said steps of radiating electron beams onto said fault-free and test semiconductor integrated circuit devices are performed by a same apparatus.

4. A method of analyzing a fault, comprising the steps of:
   a) preparing a fault-free semiconductor integrated circuit device, a test semiconductor integrated circuit device and a layout pattern of multi-level wiring strips common to said fault-free and test semiconductor integrated circuit devices, preparation of said layout pattern in said step a) comprising the sub-steps of:
      a-1) moving said electron beam on a surface of said fault-free semiconductor integrated circuit device under application of a test pattern thereto for allowing said fault-free semiconductor integrated circuit device to produce a secondary electron beam, the intensity of said secondary electron beam being varied depending upon a combination of voltage level on said multi-level wiring strips and the depth of said multi-level wiring strips,
      a-2) monitoring said secondary electron beam for producing a detected signal indicative of voltage contrast of said multi-level wiring strips and topography of said multi-level wiring strips, and
      a-3) producing topography data indicative of the topography of said multi-level wiring strips from said detected signal and, accordingly, of said layout pattern in order to prepare said layout pattern;
   b) determining radiation spots for said layout pattern of said multi-level wiring strips, said determined radiation spots being able to be exposed to a radiation of a beam and being spaced apart from one another;
   c) radiating an electron beam onto said determined radiation spots of said fault-free semiconductor integrated circuit device under application of a test pattern for allowing a first secondary electron beam to be produced at said determined radiation spots of said fault-free semiconductor integrated circuit device, the intensity of said first secondary electron beam being variable with a voltage level of said multi-level wiring strips, and the intensity of said first secondary electron beam being measured;
   d) forming an image of voltage contrast of said multi-level wiring strips of said fault-free semiconductor integrated circuit device from the measured intensity of said first secondary electron beam;
   e) radiating electron beams onto said determined radiation spots of said test semiconductor integrated circuit device under application of said test pattern for allowing a second secondary electron beam to be produced at said determined radiation spots of said test semiconductor integrated circuit device, the intensity of said second secondary electron beam being variable with a voltage level of said multi-level wiring strips of said test semiconductor integrated circuit device, and the intensity of said second secondary electron beam being measured;
   f) forming an image of voltage contrast of said multi-level wiring strips of said test semiconductor integrated circuit device from the measured intensity of said second secondary electron beam; and
   g) comparing said image of voltage contrast produced for said test semiconductor integrated circuit device with said image of voltage contrast produced for said fault-free semiconductor integrated circuit device so as to search for a discrepancy indicative of a failure origin of said test semiconductor integrated circuit device.

5. A method of analyzing a fault as set forth in claim 4, in which said radiation spots are selected from said multi-level wiring strips except for spots under upper level wiring strips.

6. A method of analyzing a fault, comprising the steps of:
   a) preparing a fault-free semiconductor integrated circuit device, a test semiconductor integrated circuit device and a layout pattern of multi-level wiring strips common to said fault-free and test semiconductor integrated circuit devices, said layout pattern being determined from a set of mask patterns used in a fabrication process sequence of said fault-free and test semiconductor integrated circuit devices;
   b) determining radiation spots on at least two wiring strips, respectively, of said multi-level wiring strips, said at least two wiring strips being different in depth from one another, said determined radiation spots being able to be exposed to a radiation of a beam and being spaced apart from one another;
   c) radiating an electron beam onto said determined radiation spots of said fault-free semiconductor integrated circuit device under application of a test pattern for allowing a first secondary electron beam to be produced at said determined radiation spots of said fault-free semiconductor integrated circuit device, the intensity of said first secondary electron beam being variable with a voltage level and depth of said multi-level wiring strips, the intensity of said first secondary electron beam being measured;
   d) a first forming step of forming an image of voltage contrast of said multi-level wiring strips of said fault-free semiconductor integrated circuit device from the measured intensity of said first secondary electron beam;
   e) radiating electron beams onto said determined radiation spots of said test semiconductor integrated circuit device under application of said test pattern for allowing a second secondary electron beam to be produced at said determined radiation spots of said test semiconductor integrated circuit device, the intensity of said second secondary electron beam being variable with a voltage level and depth of said multi-level wiring strips of said test semiconductor integrated circuit device, the intensity of said second secondary electron beam being measured;
   f) a second forming step of forming an image of voltage contrast of said multi-level wiring strips of said test semiconductor integrated circuit device from the measured intensity of said second secondary electron beam; and
   g) comparing said image of voltage contrast formed for said test semiconductor integrated circuit device with said image of voltage contrast formed for said fault-free semiconductor integrated circuit device so as to search for a discrepancy indicative of a failure origin of said defective semiconductor integrated circuit device, and wherein said second forming step includes forming said image from the measured intensity of said second secondary electron beam such that said formed image is indicative of the topography of said test semiconductor integrated circuit device.

7. A method of analyzing a fault as set forth in claim 6, in which said radiation spots are respectively selected from said multi-level wiring strips in such a manner that every radiation spot is exposed to said electron beam.

8. A method of analyzing a fault as set forth in claim 6, in which each of predetermined radiation spots selected from said radiation spots is common to wiring strips of said multi-level wiring strips equal in voltage level to one another.

9. A method of analyzing a fault as set forth in claim 6, in which said radiation spots form a two-dimensional lattice structure and are located at respective lattice points of said two-dimensional lattice structure, every two adjacent radiation spots being spaced apart from each other by length approximately equal to an average distance between two wiring strips of said multi-level wiring strips, one of said lattice points being located on one of said multi-level wiring strips.

10. A method of analyzing a fault as set forth in claim 6, in which said radiation spots form a two-dimensional lattice structure and are located at respective lattice points of said two-dimensional lattice structure, every two adjacent radiation spots being spaced apart from each other by length as large as 1/n of an average distance between two wiring strips of said multi-level wiring strips where n is a natural number, one of said lattice points being located on one of said multi-level wiring strips.

11. A method of analyzing a fault as set forth in claim 6, in which said radiation spots form a two-dimensional lattice structure and are located at respective lattice points of said two-dimensional lattice structure, every two adjacent radiation spots being spaced apart from each other by length as large as m/n of an average distance between two wiring strips of said multi-level wiring strips where m is a natural number greater than a natural number indicated by n, one of said lattice points being located on one of said multi-level wiring strips.

12. A method of analyzing a fault, comprising the steps of:

a) preparing a fault-free semiconductor integrated circuit device, a test semiconductor integrated circuit device and a layout pattern of multi-level wiring strips common to said fault-free and test semiconductor integrated circuit devices;

b) determining radiation spots for at least two wiring strips, respectively, of said multi-level wiring strips, said determined radiation spots being able to be exposed to a radiation of a beam and being spaced apart from one another;

c) radiating an electron beam onto said determined radiation spots of said fault-free semiconductor integrated circuit device under application of a test pattern for allowing a first secondary electron beam to be produced at said determined radiation spots of said fault-free semiconductor integrated circuit device, the intensity of said first secondary electron beam being variable with a voltage level and depth of said multi-level wiring strips, and the intensity of said first secondary electron beam being measured;

d) a first forming step of forming an image of voltage contrast of said multi-level wiring strips of said fault-free semiconductor integrated circuit device from the measured intensity of said secondary electron beam, said image of voltage contrast being displayed on a screen;

e) radiating electron beams onto said determined radiation spots of said test semiconductor integrated circuit device under application of said test pattern for allowing a second secondary electron beam to be produced at said determined radiation spots of said test semiconductor integrated circuit device, the intensity of said second secondary electron beam being variable with a voltage level and depth of of said multi-level wiring strips of said test semiconductor integrated circuit device, the intensity of said second secondary electron beam being measured;

f) a second forming step of forming an image of voltage contrast of said multi-level wiring strips of said test semiconductor integrated circuit device from the measured intensity of said second secondary electron beam, an optical image of said layout pattern and said image of voltage contrast for said test semiconductor integrated circuit device being displayed in an overlapped manner in a window on a screen of a display unit, said image of voltage contrast being semi-transparent so that points of said image of voltage contrast are overlapped with corresponding points of said optical image, said optical image and said image of voltage contrast being linked for navigating an analyst when one of said optical image and said image of voltage contrast is moved; and g) comparing said image of voltage contrast formed for said test semiconductor integrated circuit device with said image of voltage contrast formed for said fault-free semiconductor integrated circuit device so as to search for a discrepancy indicative of a failure origin of said defective semiconductor integrated circuit device, and wherein said second forming step includes forming said image from the measured intensity of said second secondary electron beam such that said formed image is indicative of the topography of said test semiconductor integrated circuit device.

* * * * *